(12) United States Patent
Bong et al.

(10) Patent No.: US 10,699,645 B2
(45) Date of Patent: Jun. 30, 2020

(54) SIMPLIFIED GATE DRIVER CONFIGURATION AND DISPLAY DEVICE INCLUDING THE SAME

(71) Applicant: LG Display Co., Ltd., Seoul (KR)

(72) Inventors: JunHo Bong, Gwangju (KR); WooSung Shim, Hwaseong-si (KR)

(73) Assignee: LG Display Co., Ltd., Seoul (KR)

( * ) Notice: Subject to any disclaimer, the term of this patent is extended or adjusted under 35 U.S.C. 154(b) by 149 days.

(21) Appl. No.: 15/845,829

(22) Filed: Dec. 18, 2017

(65) Prior Publication Data

US 2018/0174553 A1    Jun. 21, 2018

(30) Foreign Application Priority Data

Dec. 20, 2016   (KR) .......................... 10-2016-0174499

(51) Int. Cl.
*G09G 3/3266* (2016.01)
*G09G 3/3233* (2016.01)
(Continued)

(52) U.S. Cl.
CPC ............ *G09G 3/3266* (2013.01); *G09G 3/20* (2013.01); *G09G 3/3233* (2013.01); *G09G 5/003* (2013.01); *G09G 5/10* (2013.01); *G11C 19/28* (2013.01); *G09G 2300/0408* (2013.01); *G09G 2300/0426* (2013.01); *G09G 2310/0262* (2013.01); *G09G 2310/0267* (2013.01); *G09G 2310/0281* (2013.01); *G09G 2310/0286* (2013.01); *G09G 2310/0291* (2013.01); *G09G 2310/08* (2013.01); *G09G 2320/0233* (2013.01)

(58) Field of Classification Search
CPC ...... G09G 3/20; G09G 3/3266; G09G 3/3233; G09G 5/10; G09G 5/003; G09G 2310/0286; G09G 2310/0281; G09G 2310/0262; G09G 2310/0267; G09G 2310/0291; G09G 2310/08; G09G 2300/0408; G09G 2300/0426; G09G 2320/0233; G11C 19/28
See application file for complete search history.

(56) References Cited

U.S. PATENT DOCUMENTS 9,324,270 B2 * 4/2016 Jeong ...................... G11C 19/28
9,412,306 B2 * 8/2016 Kim ...................... G09G 3/3208
(Continued)

FOREIGN PATENT DOCUMENTS

KR   10-2015-0069773 A   6/2015
KR   10-2015-0116102 A   10/2015

*Primary Examiner* — Darlene M Ritchie
(74) *Attorney, Agent, or Firm* — Polsinelli PC

(57) ABSTRACT

Disclosed herein is a gate driver including a plurality of stages. The nth stage of the plurality of stages includes a first scan signal output unit configured to output the kth clock as a first scan signal through a first scan signal output node when a voltage of a Q-node is at a high state, and an emission control signal output unit configured to output a gate high voltage through an emission control signal output node when a voltage of the first scan signal output node and a voltage of an EQ-node are at the high state by an emission control clock. The emission control signal output unit is electrically connected to the Q-node. The gate driver includes a scan signal output and an emission control signal output, so that GIPs having the same configuration can be disposed on the left and right sides of a display panel.

13 Claims, 15 Drawing Sheets

(51) Int. Cl.
*G09G 3/20* (2006.01)
*G11C 19/28* (2006.01)
*G09G 5/00* (2006.01)
*G09G 5/10* (2006.01)

(56) References Cited

U.S. PATENT DOCUMENTS

| | | | |
|---|---|---|---|
| 10,043,586 B2 * | 8/2018 | Ma | G09G 3/3266 |
| 2012/0038609 A1 * | 2/2012 | Chung | G09G 3/003 |
| | | | 345/211 |
| 2014/0071114 A1 * | 3/2014 | Kim | G11C 19/28 |
| | | | 345/212 |
| 2015/0138180 A1 * | 5/2015 | Park | G09G 3/3233 |
| | | | 345/212 |
| 2015/0287376 A1 | 10/2015 | Lim et al. | |
| 2016/0035262 A1 * | 2/2016 | Lee | G11C 19/28 |
| | | | 345/690 |
| 2016/0042693 A1 * | 2/2016 | Cao | G09G 3/3266 |
| | | | 345/212 |
| 2016/0049116 A1 * | 2/2016 | Cao | G09G 3/3258 |
| | | | 345/213 |
| 2017/0323593 A1 * | 11/2017 | Kim | G09G 3/2092 |
| 2018/0018920 A1 * | 1/2018 | Kim | G09G 3/3266 |
| 2018/0108301 A1 * | 4/2018 | Lin | G09G 3/3266 |

* cited by examiner

SIMPLIFIED GATE DRIVER CONFIGURATION AND DISPLAY DEVICE INCLUDING THE SAME

CROSS-REFERENCE TO RELATED APPLICATION

This application claims the priority of Korean Patent Application No. 10-2016-0174499 filed on Dec. 20, 2016, in the Korean Intellectual Property Office, the disclosure of which is incorporated herein by reference in its entirety.

BACKGROUND

Field of the Disclosure

The present disclosure relates to a display device, and more particularly, to a gate driver and a display device including the same for achieving a gate driver having a narrow bezel.

Description of the Related Art

A flat panel display (FPD) has been employed in a variety of electronic devices such as mobile phones, tablet computers, laptop computers, televisions and monitors. Generally, FPDs include a liquid-crystal display (LCD), and an organic light-emitting display (OLED), etc. Such a display device includes an array of pixels in which an image is displayed, and a driving circuit that controls the pixels individually, so that light is transmitted or emitted. The driving circuit of the display device includes a data driver for applying data signals to data lines of the array of pixels, a gate driver for applying gate signals (or scanning signals) synchronized with the data signals sequentially to gate lines (or scan lines) of the array of pixels, and a timing controller for controlling the data driver and the gate driver.

As display devices become thinner, technique to incorporate a gate driver into a display panel together with the array of pixels has been inevitably considered. The gate driver incorporated in the display panel is known as "GIP (gate in panel) circuit." In order to incorporate the gate driver in the display panel, it is necessary to simplify the configuration of the gate driver.

Particularly, the gate driver is composed of a plurality of switching elements and is disposed in the display panel by being divided into blocks. Different blocks of the gate driver perform different functions and are disposed on the left and right sides of the display panel. Since the blocks of the gate driver are disposed on the left and right sides of the display panel of a display device, a problem may arise in that there is a difference in luminance between left and right sides of the display panel as the size of display panel keeps increasing.

SUMMARY

In view of the above, the present disclosure is to provide a gate driver that can output signals symmetrically on left and right sides of a display panel by way of connecting a scan signal output unit in parallel to an emission control signal output unit, and a display device including the same.

In addition, the present disclosure is to provide a gate driver that can reduce the size of the bezel of a display device by way of outputting two scan signals along with an emission control signal, and a display device including the same.

It should be noted that the present disclosure are not limited to the above-described features, and other features and advantages of the present disclosure will be apparent to those skilled in the art from the following descriptions.

According to an exemplary aspect of the present disclosure, there is provided a gate driver. The gate driver included a plurality of stages. The nth stage of the plurality of stages includes a first scan signal output unit configured to output the kth clock as a first scan signal through a first scan signal output node when a voltage of a Q-node is at a high state, and an emission control signal output unit configured to output a gate high voltage (VGH) through an emission control signal output node when a voltage of the first scan signal output node is at the high state and a voltage of an EQ-node is at the high state by an emission control clock (n and k are positive integers). The emission control signal output unit is electrically connected to the Q-node. The gate driver includes a scan signal output part as well as an emission control signal output part, so that GIPs having the same configuration can be disposed on the left and right sides of a display panel.

According to another exemplary aspect of the present disclosure, there is provided a display device. The display device includes a display panel including a plurality of pixels, and a gate driver disposed in the display panel and configured to apply gate signals through gate lines connected to each of the plurality of pixels. The gate driver includes a first scan signal output unit configured to output a kth clock as a first scan signal through a first scan signal output node between a pull-up switching element having a gate electrode connected to a Q-node and a pull-down switching element having a gate electrode connected to a QB-node, and an emission control signal output unit configured to output a gate high voltage synchronized to an emission control clock through an emission control signal output node between an emission control pull-up switching element having a gate electrode connected to an EQ-node and an emission control pull-down switching element having a gate electrode connected to an EQB-node. The emission control signal output unit is connected in parallel to the first scan signal output unit at the Q-node and the QB-node. In the display device, a single gate driver can output scan signals and an emission control signal simultaneously, so that the size of the area where the gate driver is disposed to thereby reduce the size of the bezel of the display device.

The details of one or more aspects of the subject matter described in this specification are set forth in the accompanying drawings and the description below.

According to an exemplary aspect of the present disclosure, the gate driver includes a scan signal output unit as well as an emission control signal output unit, so that GIPs having the same configuration can be disposed on the left and right sides of a display panel.

According to an exemplary aspect of the present disclosure, a single gate driver can output scan signals and an emission control signal simultaneously, so that the size of the area where the gate driver is disposed to thereby reduce the size of the bezel of the display device.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
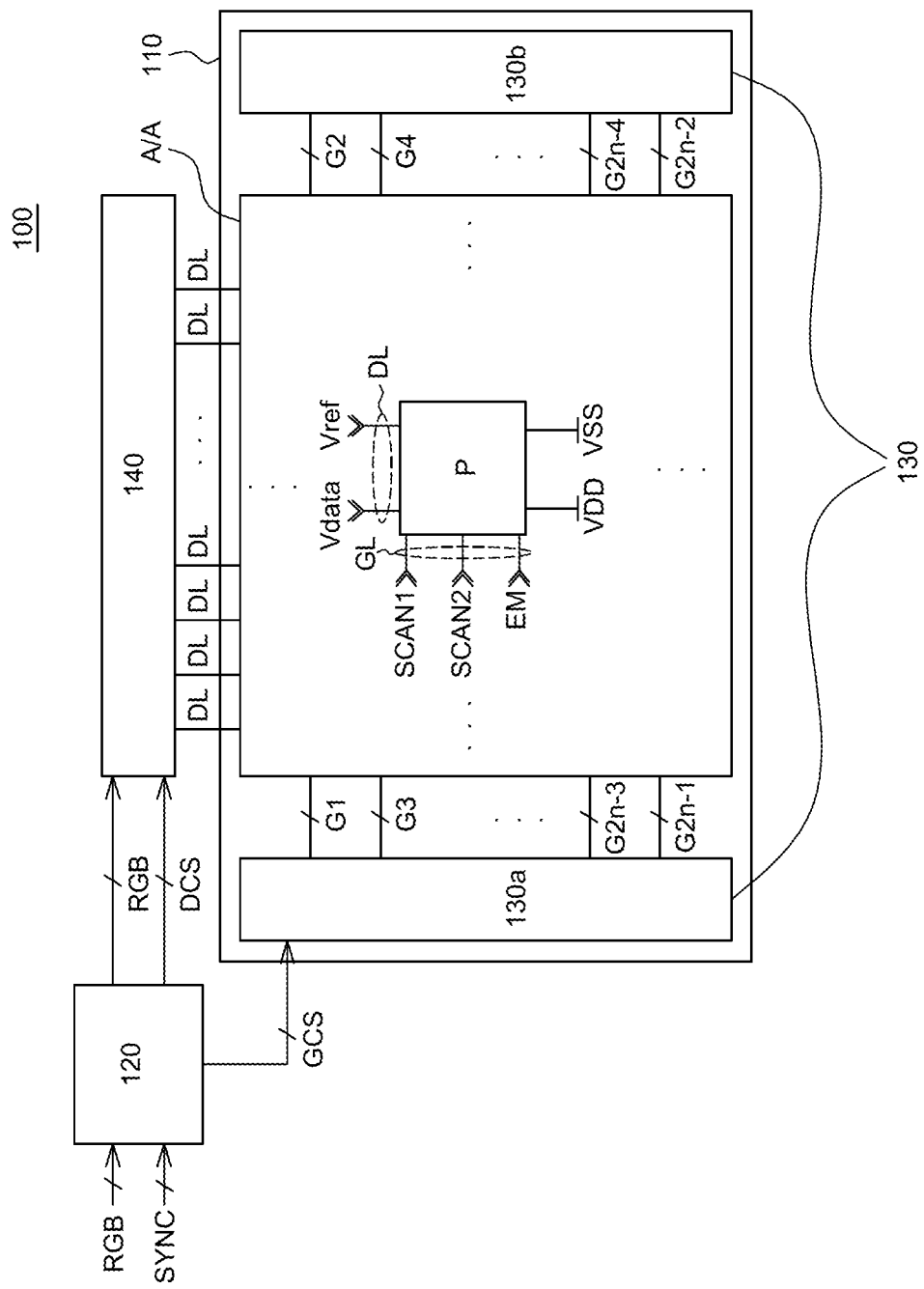
FIG. 1 is a block diagram of a display device for illustrating a gate driving circuit according to an exemplary aspect of the present disclosure.

Advantages and features of the present disclosure and methods to achieve them will become apparent from the descriptions of exemplary aspects herein below with reference to the accompanying drawings. However, the present disclosure is not limited to exemplary aspects disclosed herein but may be implemented in various different ways. The exemplary aspects are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," and "the," this includes a plural of that noun unless specifically stated otherwise.

For elements having specific values, they are interpreted as including error margins even without explicit statements.

In describing positional relationship, such as "an element A on an element B," "an element A above an element B," "an element A below an element B," and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B through another element C.

The terms first, second and the like in the descriptions and in the claims are used for distinguishing between similar elements and not necessarily for describing a sequential or chronologic circuital order. These terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various exemplary aspects of the present disclosure may be combined partially or totally. As will be clearly appreciated by those skilled in the art, technically various interactions and operations are possible. Various exemplary aspects can be practiced individually or in combination.

Herein, TFTs may be implemented as p-type or n-type transistors. In describing scan signals in the form of pulses, a gate high voltage VGH level is defined as "high state" while a gate low voltage VGL level is defined as "low state."

Hereinafter, exemplary aspects of the present disclosure will be described in detail with reference to the accompanying drawings.

FIG. 1 is a block diagram of a display device for illustrating a gate driving circuit according to an exemplary aspect of the present disclosure;

Referring to FIG. 1, a display device 100 includes a display panel 110 including a plurality of pixels P, gate drivers 130 (including 130a and 130b) for applying gate signals to the plurality of pixels P, a data driver 140 for applying data signals to the plurality of pixels P, and a timing controller 120 for controlling the gate drivers 130 and the data driver 140.

The timing controller 120 processes image data RGB input from an external source appropriately for the size and the resolution of the display panel 110 to supply it to the data driver 140. The timing controller 120 receives synchronization signals SYNC input from an external source such as a dot clock signal, a horizontal synchronization signal and a vertical synchronization signal, and generates gate control signals and data control signals by using them. The timing controller 120 applies the generated the gate control signals GCS and the data control signals DCS to the gate drivers 130 and the data driver 140, respectively, to thereby control the gate drivers 130 and the data driver 140.

The gate drivers 130a and 130b apply the gate signals to the gate lines GL in response to the gate control signals GCS received from the timing controller 120. The gate signals include at least one scan signal and an emission control signal. The gate drivers 130 include a first gate driver 130a and a second gate driver 130b. The first gate driver 130a and the second gate driver 130b are disposed symmetrically with respect to a display area A/A and may have the same configuration. It is, however, to be noted that the first gate driver 130a may apply gate signals to odd gate lines, while the second gate driver 130b may apply gate signals to even gate lines. Each of the first and second gate drivers 130a and 130b includes a plurality of stages. Each of the stages outputs gate signals and provides the gate signals to the active area A/A through the gate lines G1 to Gn. The configuration of the gate drivers 130a and 130b will be described in more detail with reference to FIG. 2.

Although the gate drivers 130 are illustrated as being disposed on the two sides in the display panel 110 in FIG. 1, the number and locations of the gate drivers 130 are not limited thereto. That is, the gate drivers 130 may be disposed only on one side of the display panel 110 as a GIP (gate in panel).

Each of the gate drivers 130a and 130b includes a plurality of stages. In the gate drivers, each of the plurality of stages may include a plurality of switching elements. The configuration of the stages in the gate drivers will be described in more detail with reference to FIG. 3.

The data driver 140 converts image data RGB into data voltage according to the data control signal DCS received from the timing controller 120 and applies the converted data voltage to the pixels P through the data lines DL.

A plurality of gate lines GL and a plurality of data lines DL intersect with one another in the display panel 110. Each of the plurality of pixels P is connected to the respective gate lines GL and the respective data lines DL. Specifically, one pixel P receives gate signals from the gate driver 130 through the gate lines GL and receives data signals from the data driver 140 through the data lines DL. Accordingly, one pixel P may receive an emission signal EM and scan signals SCAN1 and SCAN2 through the gate lines GL and may receive the data voltage Vdata and a reference voltage Vref through the data lines DL.

The display device 100 according to the exemplary aspect of the present disclosure includes the gate driver 130 for driving the display panel 110 including the plurality of pixels P, the data driver 140, and the timing controller 120. The gate drivers 130 include the first gate driver 130a and the second gate driver 130b that have the same configuration and are disposed on the two sides in the display panel 110. The gate drivers 130 includes at least one scan signal output unit and an emission control signal output unit in each of the plurality of stages. Accordingly, in the gate drivers 130, one stage can output a scan signal as well as an emission control signal. Thus, the first gate driver 130a and the second gate driver 130b disposed on the two sides in the display panel 110 may include the same stages and may apply the scan signals and emission control signals from the two sides of the display panel 100 symmetrically. Moreover, even if the gate driver 130a or 130b is disposed only one side of the display panel 100, it is possible to substantially reduce the space in which the gate drivers 130 are disposed in the display device 110 as a single stage of the gate drivers 130 can output scan signals as well as an emission control signal.

Figure 2:
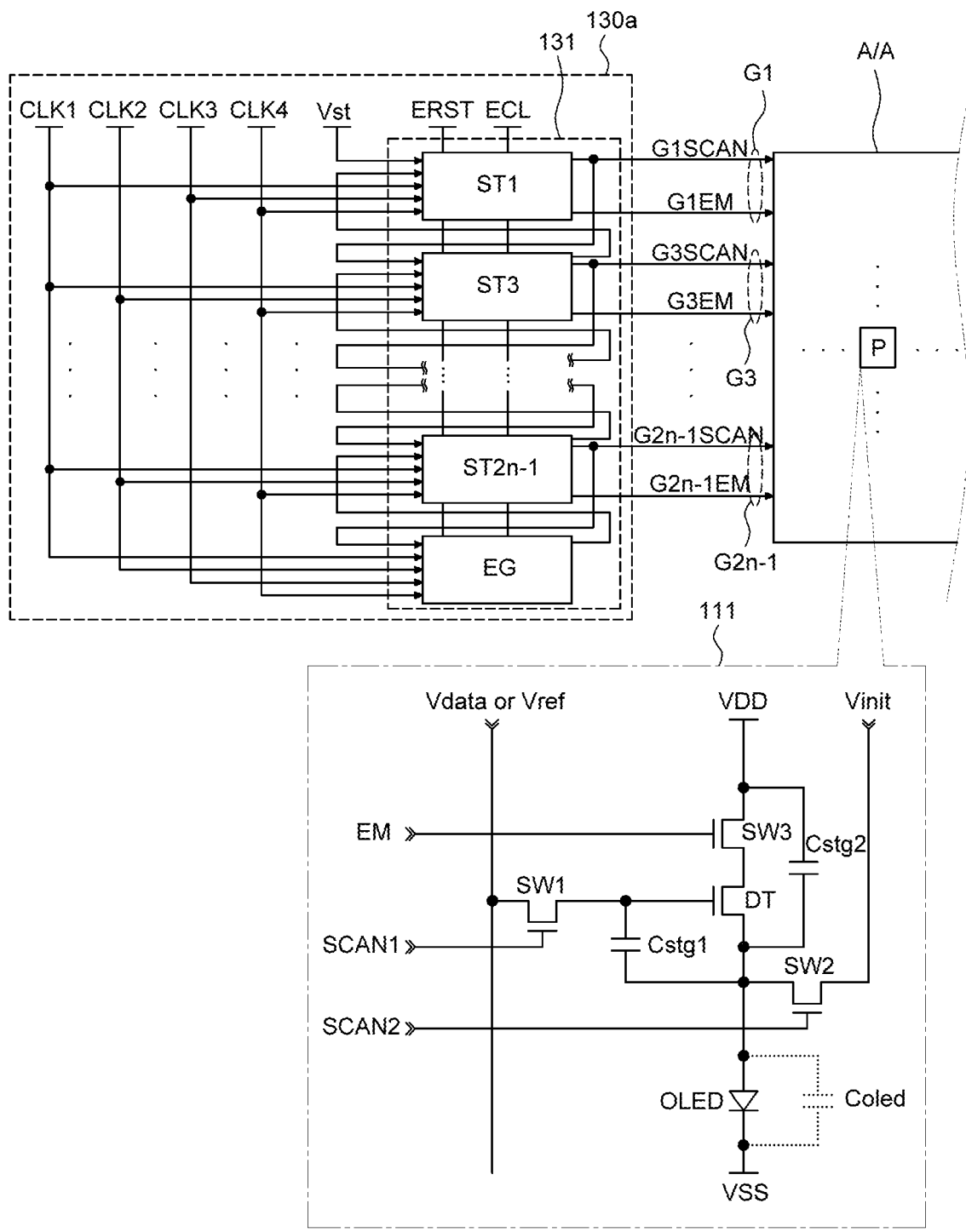
FIG. 2 is a block diagram of a gate driver according to an exemplary aspect of the present disclosure.

FIG. 2 is a block diagram of a gate driver according to an exemplary aspect of the present disclosure. For convenience of illustration, description will be made with reference to FIG. 1.

Referring to FIG. 2, the first gate driver 130a is disposed on one side of the active area A/A. Although FIG. 2 shows only the first gate driver 130a disposed on one side of the active area A/A, it is to be understood that the second gate driver 130b may be disposed on the opposite side of the active area A/A so that they may be symmetrical with each other. Also, in some aspects of the present disclosure, the gate drivers 130 may be disposed only on one side of the active area A/A like the first gate driver 130a of FIG. 2. Accordingly, the first gate driver 130a disposed on one side of the active area A/A will be described as an example, and the second gate driver 130b will not be described to avoid redundancy.

The first gate driver 130a may include a dummy stage EG that generates no output but applies a carry signal to another stage. Specifically, the first gate driver 130a may include the dummy stage EG next to the last stage ST(2n−1). That is, the dummy stage EG is connected to the last stage ST(2n−1) that outputs the last gate signals, and the dummy stage EG generates no gate signal and provides a carry signal to the last stage ST(2n−1).

The first gate driver 130a includes a plurality of stages ST1 to ST(2n−1). Each of the plurality of stages ST1 to ST(2n−1) outputs one or more scan signals G1SCAN to G(2n−1)SCAN and emission control signals G1EM to G(2n−1)EM. The configuration of one of the plurality of stages ST1 to ST(2n−1) will be described in detail later with reference to FIG. 3.

The first gate driver 130a sequentially applies the gate signals to the active area A/A through the gate lines G1 to G(2n−1). Specifically, the first gate driver 130a receives the gate driving circuit control signal GDC to generate gate signals. The gate driver control signal GDC includes a gate start pulse (GSP) and gate shift clocks (GSC) CLK1, CLK2, CLK3 and CLK4, etc. In addition, the first gate driver 130a receives an emission control reset signal ERST and an emission control clock CLK to control the timing of outputting the emission control signal EM. That is, the first clock CLK1, the second clock CLK2, the third clock CLK3, the fourth clock CLK4, the carry signal received from the previous stage or the start voltage VST, the gate high voltage VGH, the gate low voltage VGL, the emission control reset signal ERST and the emission control clock CLK are input to the first gate driver 130a. The plurality of gate shift clocks CLK1, CLK2, CLK3 and CLK4 includes the first clock CLK1, the second clock CLK2, the third clock CLK3 and the fourth clock CLK4. Herein, the gate start pulse GSP and the start voltage VST may be used interchangeably. The start voltage VST and the input/output signals in response to it at the stages will be described later with reference to FIG. 4.

Accordingly, the first gate driver 130a sequentially applies the gate signals generated in each of the plurality of stages ST1 to ST(2n−1) to the gate lines G1 to G(2n−1) in response to the gate driver control signal GDC. Specifically, the stages ST1 to ST(2n−1) of the first gate driver 130a start to generate gate signals in response to the start voltage VST, and the switching elements included in the stages ST1 to ST(2n−1) operate in different periods in response to the first to fourth clocks CLK1 to CLK4, such that the gate signals are shifted and output.

Particularly, three out of four clocks, i.e., the first clock CLK1 to the fourth clock CLK4 may be applied to each of the plurality of stages ST1 to ST(2n−1). For example, the first clock CLK1, the third clock CLK3 and the fourth clock CLK4 may be applied to the first stage ST1, while the first clock CLK1, the second clock CLK2 and the fourth clock CLK4 may be applied to the third stage ST3. That is, although four kinds of clocks are applied to the entire stages ST1 to ST(2n−1), only three of them may be applied to each of the stages to output gate signals.

On the other hand, when each of the plurality of stages ST1 to ST(2n−1) outputs a plurality of scan signals, the four kinds of clocks may be applied to each of the plurality of stages ST1 to ST(2n−1). Specifically, three clocks out of the first clock CLK1 to the fourth clock CLK4 may be applied to each of the plurality of stages ST1 to ST(2n−1), and one of the clocks applied to the next stage may be further applied. For example, the first clock CLK1, the third clock CLK3 and the fourth clock CLK4 may be applied to the first stage ST1, and the first clock CLK1 among the clocks applied to the third stage ST3 may be further applied to the first stage ST1.

The gate signals output from each of the stages ST1 to ST(2n−1) are transmitted to the gate lines G1 to G(2n−1) and are also input to the next stages as carry signals. The operations of switching elements included in the stages ST1 to ST(2n−1) in each of the different periods of time in response to the first clock CLK1 to the fourth clock CLK4 will be described later with reference to FIGS. 4 to 5D.

Referring to FIG. 2, each of the plurality of pixels P includes a pixel driving circuit 111. The pixel driving circuit 111 includes a first pixel driving switching element SW1, a second pixel driving switching element SW2, a third pixel driving switching element SW3, a driving switching element DT, a first storage capacitor Cstg1, and a second storage capacitor Cstg2. The first scan signal SCAN1 is applied to the first pixel driving switching element SW1, the second scan signal SCAN2 is applied to the second pixel driving switching element SW2, and the emission control signal EM is applied to the third pixel driving switching element SW3. The gate signals generated in each of the plurality of stages ST1 to STn may include the first scan signal SCAN1, the second scan signal SCAN2, and the emission control signal EM. The pixel driving circuit 111 shown in FIG. 2 is merely an example and may be configured in various ways in other exemplary aspects.

The gate drivers 130 according to the exemplary aspect of the present disclosure include the plurality of stages ST1 to STn. Each of the plurality of stages ST1 to STn includes at least one scan signal output unit for outputting at least one scan signal GnSCAN, and an emission control signal output unit for outputting an emission control signal GnEM. Accordingly, each of the plurality of stages ST1 to ST(2n−1) sequentially transmits gate signals, i.e., at least one scan signal GnSCAN and an emission control signal GnEM to the gate lines G1 to Gn. Accordingly, the gate drivers 130 may be disposed on the two sides of the display panel 110 as the same GIPs (Gates-In-Panel). Further, the gate drivers 130 may output the scan signals and the emission control signal simultaneously, thereby reducing the area required for disposing the gate drivers 130 in the display device 100. The circuit configuration of each of the plurality of stages ST1 to ST(2n−1) will be described in more detail with reference to FIG. 3.

Figure 3:
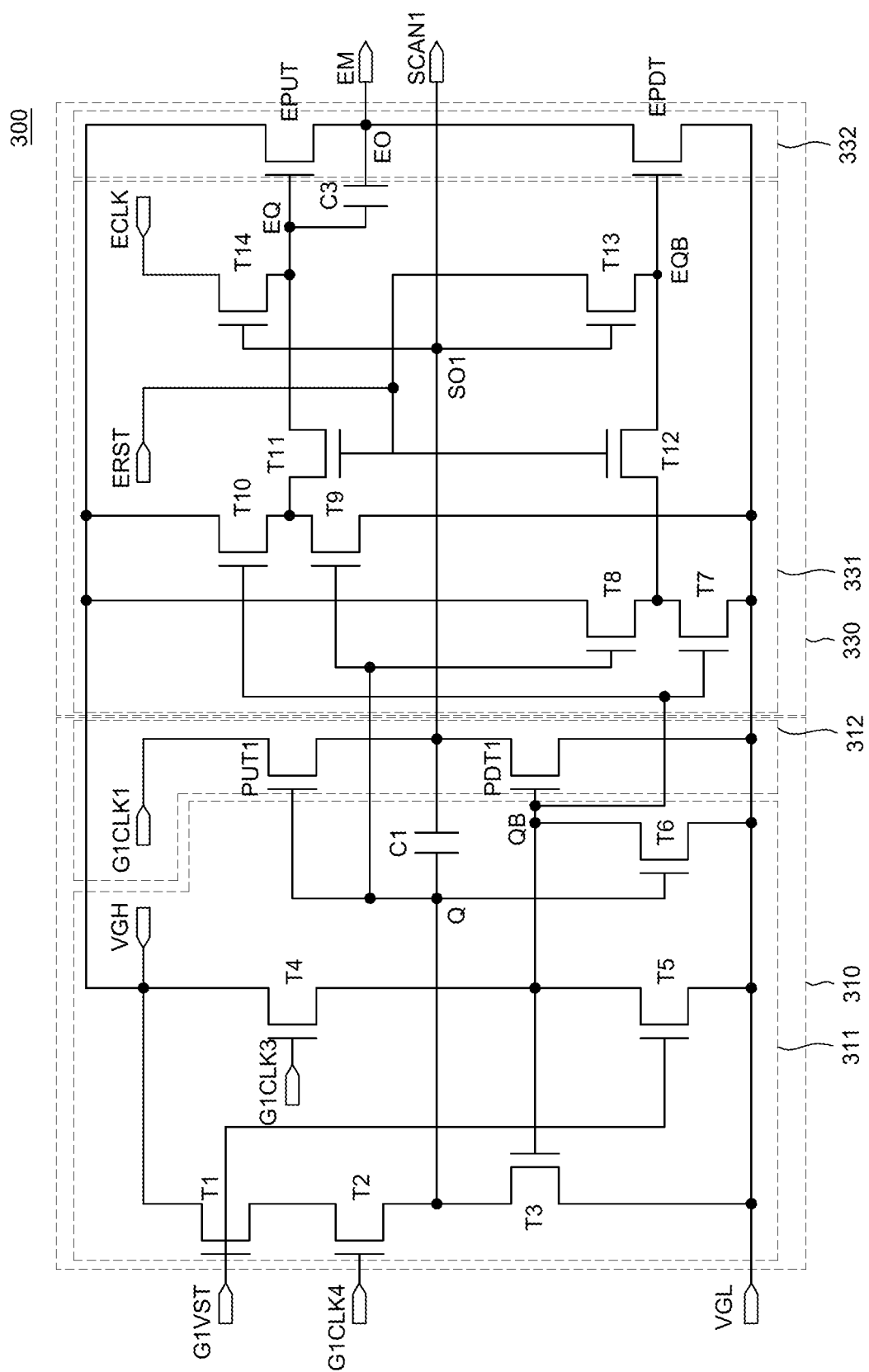
FIG. 3 is a circuit diagram showing a configuration of one of the plurality of stages in the gate drivers according to an exemplary aspect of the present disclosure.

FIG. 3 is a circuit diagram showing a configuration of one of the plurality of stages in the gate drivers according to an exemplary aspect of the present disclosure. Descriptions will be made with reference to FIGS. 1 and 2 for convenience of illustration.

Referring to FIG. 3, the stage 300 includes a first scan signal output unit 310 and an emission control signal output unit 330. The stage 300 outputs the first scan signal SCAN1 through a first scan signal output node SO1 of the first scan signal output unit 310 and outputs the emission control signal EM through an emission control signal output node EO of the emission control signal output unit 330.

Specifically, the first scan signal output unit 310 includes a first logic circuit 311 and a first buffer 312.

Referring to FIG. 3, the first logic circuit 311 includes a first switching element T1, a second switching element T2, a third switching element T3, a fourth switching element T4, a fifth switching element T5, a sixth switching element T6, and a first capacitor C1. It is to be noted that the TFTs are merely illustrative and different kinds of switching elements may be used in other implementations.

Specifically, the first switching element T1 includes a gate electrode to receive the start voltage G1VST, and is connected to a gate high voltage line that applies the gate high voltage VGH. The second switching element T2 includes a gate electrode to receive the fourth clock G1CLK4, and is connected to a Q-node. The third switching element T3 includes a gate electrode connected to a QB-node and is disposed between the gate low voltage line and the second switching element T2. The fourth switching element T4 includes a gate electrode to receive the third clock G1CLK3, and is connected to the gate high voltage line. The fifth switching element T5 includes a gate electrode to receive the start voltage G1VST, and is disposed between the gate low voltage line and the fourth switching element T4. The sixth switching element T6 includes a gate electrode connected to the Q-node, and is disposed between the QB-node and the gate low voltage line.

The first capacitor C1 is disposed between the Q-node and the first scan signal output node SO1. That is, the first capacitor C1 is disposed between a gate electrode and a source electrode of a first pull-up switching element PUT1 and between a gate electrode and a source electrode of a first pull-down switching element PDT1. Accordingly, the first capacitor C1 can bootstrap the gate electrode and the source electrode of the first pull-up switching element PUT1 according to the voltage of the Q-node and the waveform of the first clock G1CLK1.

The first logic circuit 311 may output the voltage of the Q-node and the voltage of the QB-node so that they are opposite to each other. That is, in the first logic circuit 311, the voltage of the Q-node and the voltage of the QB-node are inverted from each other. For example, when the voltage of the Q-node is at high state, then the voltage of the QB-node is at low state. When the voltage of the Q-node is at low state, then the voltage of the QB-node is at high state. Accordingly, the first logic circuit 311 may determine the state of the first scan signal SCAN1 output from the first buffer 312 based on the voltage of the Q-node and the voltage of the QB-node.

Referring to FIG. 3, the first buffer 312 includes the first pull-up switching element PUT1 and the first pull-down switching element PDT1. Specifically, the first pull-up switching element PUT1 has the gate electrode connected to the Q-node, and is disposed between the first clock line for applying the first clock G1CLK1 and the first scan signal output node 501. The first pull-down switching element PDT1 includes the gate electrode connected to the QB-node and is disposed between the gate low voltage line for applying the gate low voltage VGL and the first scan signal output node 501.

In the first buffer 312, the first scan signal output node SO1 is connected between the first pull-up switching element PUT1 and the first pull-down switching element PDT1. Accordingly, the first buffer 312 may generate the first scan signal SCAN1 under the control of the first logic circuit 311, and the first scan signal output unit 310 may output the first scan signal SCAN1 to the gate line connected to the first scan signal output node 501. Further, the voltage of the first scan signal output node SO1 may control the operation of the emission control signal output unit 330.

The first logic circuit 311 is electrically connected to the emission control signal output unit 330 through the Q-node and the QB-node. The first buffer 312 is connected to the emission control signal output unit 330 through the first scan signal output node 501. That is, the first scan signal output unit 310 is electrically connected to the emission control signal output unit 330 through the Q-node, the QB-node and the first scan signal output node SO1.

In addition, the emission control signal output unit 330 includes an emission control logic circuit 331 and an emission control buffer 332.

Referring to FIG. 3, the emission control logic circuit 331 includes a seventh switching element T7, an eighth switching element T8, a ninth switching element T9, a tenth switching element T10, an eleventh switching element T11, a twelfth switching element T12, a thirteenth switching element T13, a fourteenth switching element T14, and a third capacitor C3.

Specifically, the seventh switching element T7 includes a gate electrode connected to the QB-node, and is disposed between the eighth switching element T8 and the gate low voltage line. The eighth switching element T8 includes a gate electrode connected to the Q-node, and is disposed between the seventh switching element T7 and the gate high voltage line. The ninth switching element T9 includes a gate electrode connected to the Q-node, and is disposed between the tenth switching element T10 and the gate low voltage line. The tenth switching element T10 includes a gate electrode connected to the QB-node, and is disposed between the ninth switching element T9 and the gate high voltage line. The eleventh switching element T11 includes a gate electrode connected to the emission control reset signal line for supplying the emission control reset signal ERST and the EQ-node, and is connected between the EQ-node and the output node of the ninth switching element T9 and the tenth switching element T10. The twelfth switching element T12 includes a gate electrode connected to the emission control reset signal line and is disposed between an EQB-node and the output node of the seventh switching element T7 and the eighth switching element T8.

The fourteenth switching element T14, which is a first emission control switching element, has a gate electrode connected to the first scan signal output node SO1, and is disposed between an emission control clock line for applying an emission control clock ECLK and the EQ-node. The thirteenth switching element T13, which is a second emission control switching element, has a gate electrode connected to the first scan signal output node SO1, and is disposed between the emission control reset signal line for applying the emission control reset signal ERST and the EQB-node.

The third capacitor C3 is disposed between the EQ-node and the emission control signal output node EO. That is, the third capacitor C3 is disposed between the gate electrode and the source electrode of an emission control pull-up switching element EPUT. Accordingly, the third capacitor C3 may bootstrap the gate electrode and the source electrode of the emission control pull-up switching element EPUT according to the voltage of the EQ-node and the waveform of the emission control clock ECLK.

Referring to FIG. 3, the emission control buffer 332 includes an emission control pull-up switching element EPUT and an emission control pull-down switching element EPDT. Specifically, the emission control pull-up switching element EPUT includes a gate electrode connected to the EQ-node, and is connected to the gate high voltage line for applying the gate high voltage VGH. The emission control pull-down switching element EPDT includes a gate electrode connected to the EQB-node, and is disposed between the gate low voltage line for supplying the gate low voltage VGL and the emission control signal output node EO. The emission control signal output node EO is connected between the emission control pull-up switching element EPUT and the emission control pull-down switching element EPDT in the emission control buffer 332.

The emission control signal output unit 330 is connected in parallel with the first scan signal output unit 310 at the Q-node and the QB-node. Specifically, in the emission control logic circuit 331, the thirteenth switching element T13 and the fourteenth switching element T14 are connected to the first scan signal output node 501. In particular, the first scan signal output node SO1 is connected to the gate electrode of the thirteenth switching element T13 and the gate electrode of the fourteenth switching element T14. Accordingly, the voltage of the first scan signal output node SO1 may determine whether to turn on the thirteenth switching element T13 and the fourteenth switching element T14. Further, the voltage of the first scan signal output node SO1 may determine the timing and period of time to output the emission control signal EM together with the emission control clock ECLK. The timing and period of time to output the first scan signal SCAN1 and the emission control signal EM will be described in detail later with reference to FIGS. 4 to 5D.

The first clock CLK1, the third clock CLK3, the fourth clock CLK4, the start voltage VST, the gate high voltage VGH and the gate low voltage VGL are applied to the stage 300. Each of the first clock CLK1, the third clock CLK3, the fourth clock CLK4 and the start voltage VST is at the gate high voltage VGH level when it is at the high state, and is at the gate low voltage VGL level when it is at the low state.

Accordingly, in the first scan signal output unit 310, the first pull-up switching element PUT1 outputs the first clock G1CLK1 to the first scan signal output node SO1 according to the voltage of the Q-node. In addition, in the emission control signal output unit 330, the emission control pull-up switching element EPUT outputs the gate high voltage (VGH) to the emiss control signal output node EO according to the voltage of the EQ-node while the emission control clock ECLK. The voltage of the EQ-node is controlled by the output signals from the first scan signal output unit 310 through the Q-node, the QB-node and the first scan signal output node 501. That is, the voltage of the EQ-node is determined by the first scan signal SCAN1, the voltage of the Q-node and the voltage of the QB-node output according to the timing to apply the first clock CLK1, the third clock CLK3, the fourth clock CLK4 and the start voltage VST1 to the stage 300.

Figure 4:
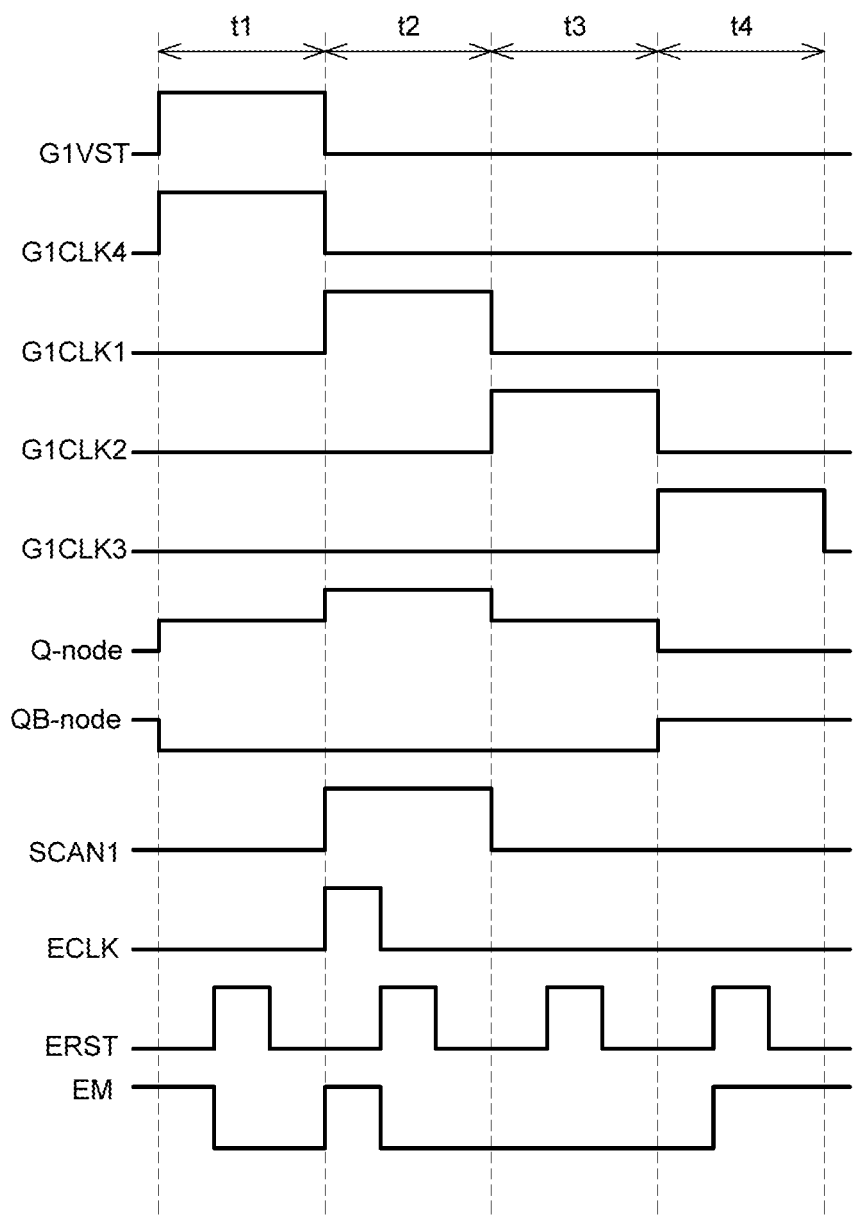
FIG. 4 is a waveform diagram showing input/output signals in the stages of the gate driver shown in FIG. 3 according to an exemplary aspect of the present disclosure.
Figure 5A:
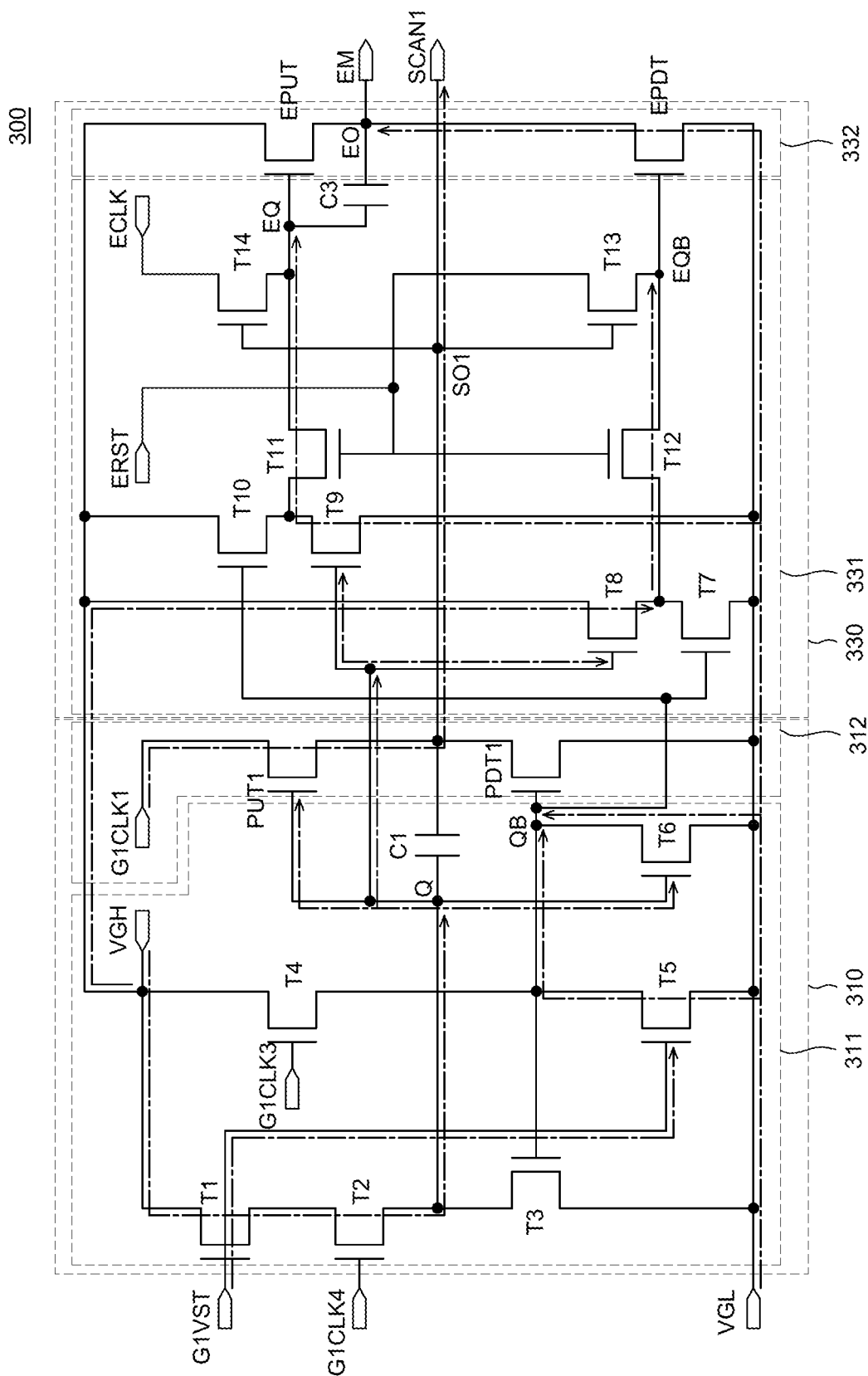
FIGS. 5A to 5D are circuit diagrams illustrating signal flows in the stages of the gate driver according to the waveform diagram shown in FIG. 4 according to an exemplary aspect of the present disclosure.
Figure 5B:
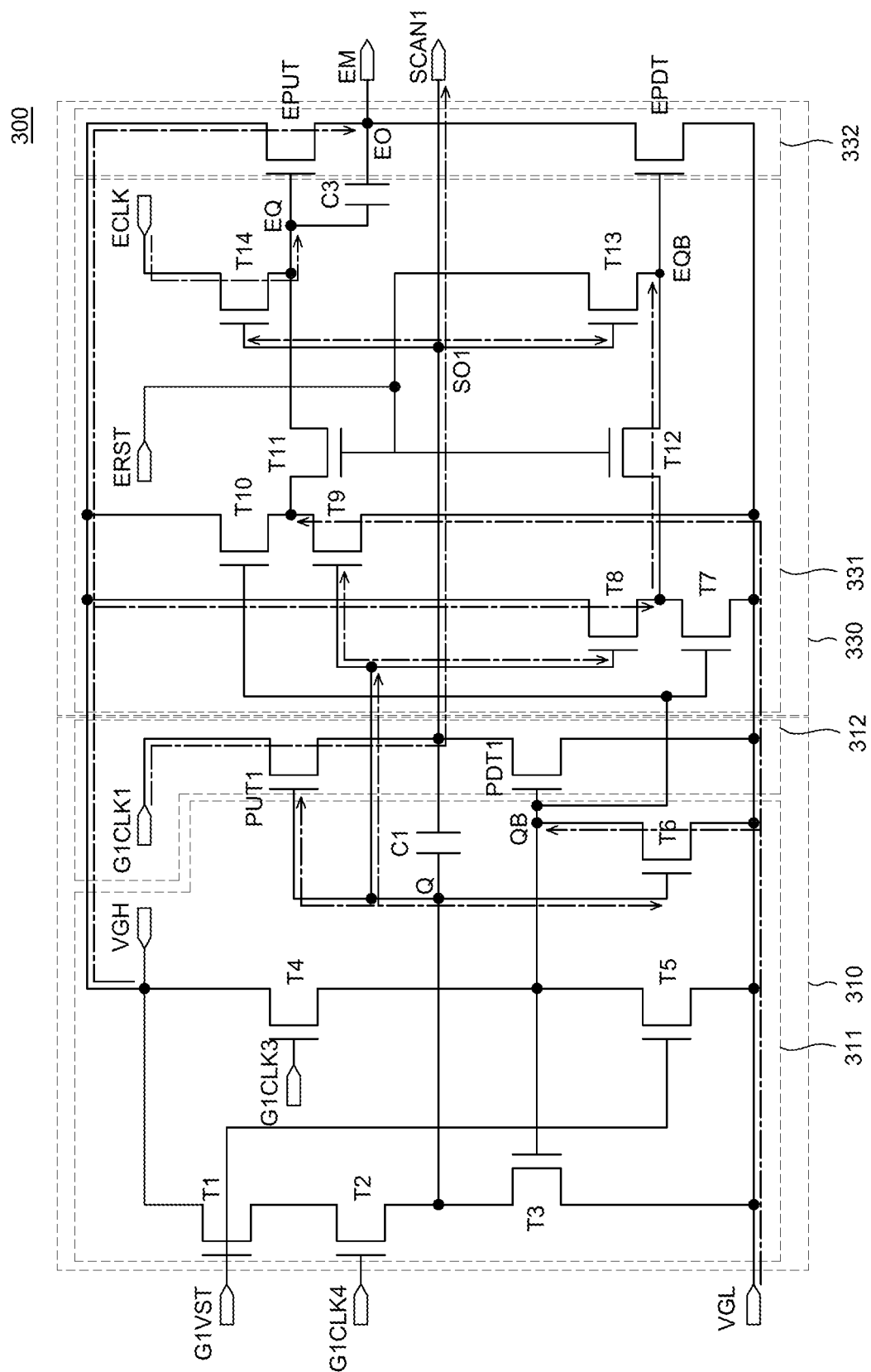
Figure 5C:
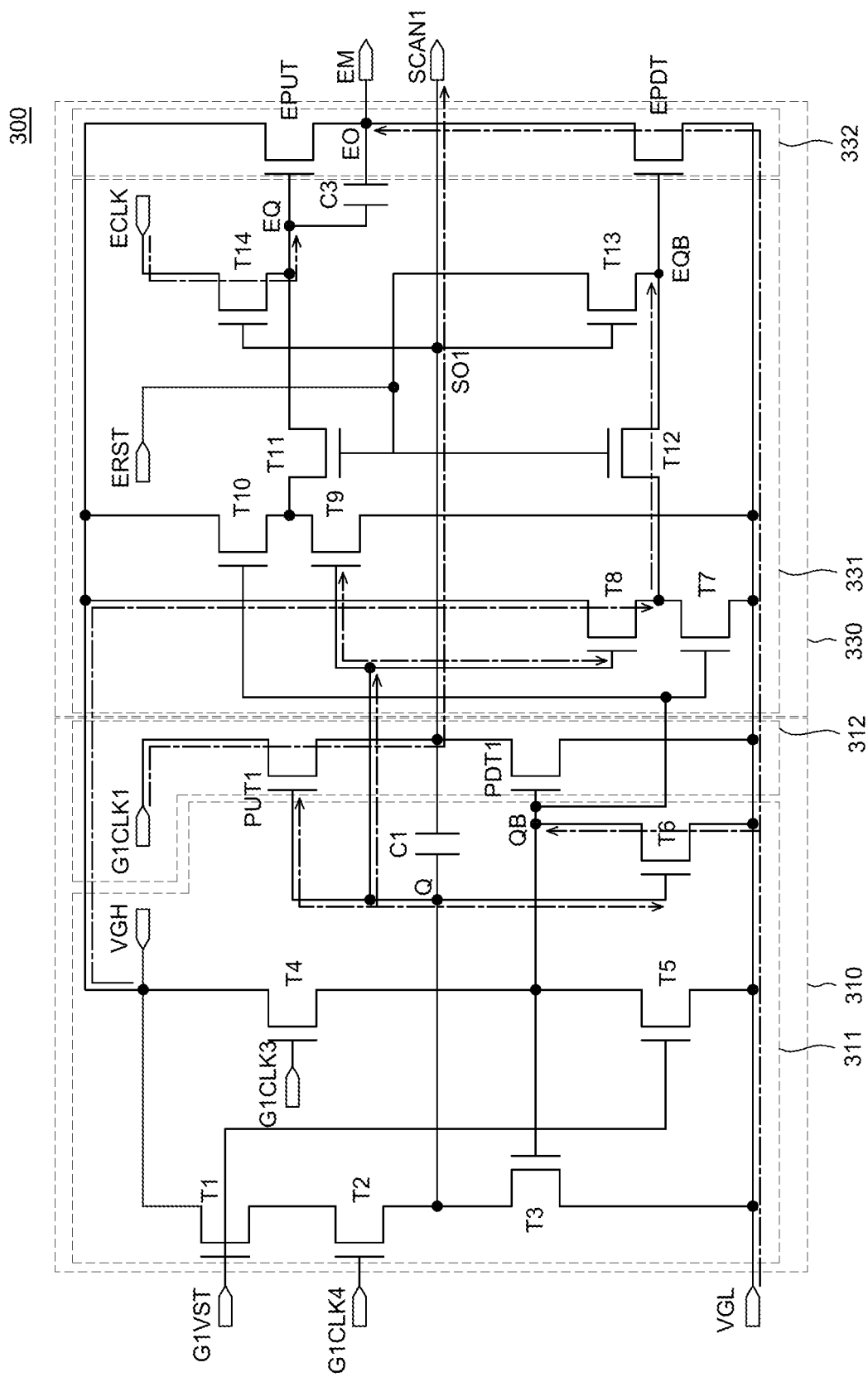

FIG. 4 is a waveform diagram showing input/output signals in the stages of the gate driver shown in FIG. 3 according to an exemplary aspect of the present disclosure. FIGS. 5A to 5D are circuit diagrams illustrating signal flows in the stages of the gate driver according to the waveform diagram shown in FIG. 4 according to an exemplary aspect of the present disclosure. The circuit diagrams shown in FIGS. 5A to 5D illustrate signal flows during different periods of time in response to input/output signals. The circuit diagrams shown in FIGS. 5A to 5D include the elements identical to those of the circuit diagram shown in FIG. 3; and, therefore, the stage 300 will not be described to avoid redundancy. In FIGS. 5A to 5C, dash-dot lines indicate the flows of the internal signals in response to the signals input to the stage 300. Descriptions will be made with reference to FIGS. 1 and 2 for convenience of illustration.

Referring to FIG. 4, based on the pulse timings of the first clock G1CLK1, the second clock G1CLK2, the third clock G1CLK3, the fourth clock G1CLK4 and the start voltage VST applied to the stage 300, the stage 300 operates in different periods of time, i.e., the first period of time t1, the second period of time t2, the third period of time t3 and the fourth period of time t4.

In the first period of time t1, the start voltage G1VST and the fourth clock G1CLK4 are input to the stage 300 at the high state, while the first clock CLK1 and the third clock CLK3 are input to the stage 300 at the low state.

In the second period of time t2, only the first clock CLK1 is input to the stage 300 at the high state, while the third clock CLK3, the fourth clock CLK4 and the start voltage VST are input to the stage 300 at the low state.

In the third period of time t3, only the second clock CLK2 is applied to the first gate driver 130a at the high state, while the first clock CLK1, the third clock CLK3, the fourth clock CLK4 and the start voltage VST are input at the low state.

In the fourth period of time t4, only the third clock CLK3 is input at the high state, while the first clock CLK1, the fourth clock CLK4 and the start voltage VST are input at the low state.

Until the start voltage G1VST is input at the high state after the fourth period of time t4, the first clock CKL1, the third clock CLK3 and the fourth clock CLK4 are all input at the low state.

The first clock CLK1 to the fourth clock CLK4 are supplied to the gate drivers 130 with phase differences so that they do not overlap with one another during the first period of time t1 to the fourth period of time t4. Such a scheme for driving the gate drivers 130 using four clocks is referred to as a four-phase driving scheme.

Referring to FIGS. 4 and 5A, in the first period of time t1, the start voltage VST and the fourth clock CLK4 are input to the stage 300 at the high state, so that the first switching element T1, the second switching element T2 and the fifth switching element T5 are all turned on. That is, the start voltage VST is applied at the high state so that the first switching element T1 and the fifth switching element T5 are turned on, and the fourth clock CLK4 is applied at the high state so that the second switching element T2 is turned on.

Further, the gate high voltage VGH is applied to the Q-node as the second switching element T2 is turned on. In this manner, when the start voltage VST and the fourth clock CLK4 both are at the high state, the first switching element T1 and the second switching element T2 may charge the Q-node to the high state. Further, as the fifth switching element T5 is turned on, the gate low voltage VGL is applied to the QB-node. That is, in the first period of time t1, the voltage of the Q-node is at the high state and the voltage of the QB-node is at the low state.

Referring to FIGS. 4 and 5A, as the voltage of the Q-node is at the high state, the first pull-up switching element PUT1 of the first buffer 312, the eighth switching element T8 and the ninth switching element T9 of the emission control logic circuit 331 are turned on. In the first period of time t1, the eleventh switching element T11 and the twelfth switching element T12 are turned on while the emission control reset signal ERST is at the high state.

As the first pull-up switching element PUT1 is turned on, the first clock G1CLK1 is input to the first scan signal output node SO1 at the low state. That is, in the first period of time t1, the first scan signal output unit 310 outputs the first scan signal SCAN1 at the low state.

In addition, the gate high voltage VGH is applied to the EQB-node through the eighth switching element T8, and the gate low voltage VGL is applied to the EQ-node through the ninth switching element T9. The voltage of the EQB-node is held at the high state while the emission control reset signal ERST is at the high state, and the emission control pull-down switching element EPDT is turned on as soon as the voltage of the EQB-node is changed to the high state. Accordingly, the gate low voltage VGL is applied to the emission control output node EO through the gate low voltage line connected to the emission control pull-down switching element EPDT. That is, the twelfth switching element T12 is turned on as soon as the emission control reset signal ERST is changed to the high state, so that the emission control signal EM is changed to the low state.

In this manner, the first scan signal output unit 310 is electrically connected to the emission control signal output unit 330 through the Q-node. The emission control signal output unit 330 may be controlled with the voltage of the Q-node and the voltage of the QB-node. Accordingly, in the first period of time t1, the stage 300 may simultaneously output the first scan signal SCAN1 at the low state through the first scan signal output unit 310 and the emission control signal EM that is changed from the high state to the low state through the emission control signal output unit 330.

Subsequently, referring to FIGS. 4 and 5B, as the first clock G1CLK1 is input to the stage 300 at the high state in the second period of time t2, the first clock G1CLK1 is output to the first scan signal output node SO1 through the first pull-up switching element PUT1. Specifically, in the second period of time t2, the voltage of the Q-node is at the high state so that the first pull-up switching element PUT1 in the first buffer 312 and the sixth switching element T6 in the first logic circuit 311 are turned on, and the voltage of the QB-node is at the low state so that the first pull-down switching element PDT1 is turned off.

Accordingly, the first clock signal G1CLK1 at the high state is applied to the first scan signal output node SO1 through the turned-on first pull-up switching element PUT1, and the gate low voltage VGL is applied to the QB-node from the gate low voltage line connected to the turned-on sixth switch element T6. That is, when the voltage of the Q-node is at the high state, the first scan signal output unit 310 outputs the first clock G1CLK1 at the high state as the first scan signal SCAN1 through the first scan signal output node SO1.

On the other hand, in the second period of time t2, as the voltage of the Q-node is at the high state, the eighth switching element T8 and the ninth switching element T9 are turned on in the emission control logic circuit 331. In addition, as the voltage of the first scan signal output node SO1 is at the high state in the second period of time t2, the thirteenth switching element T13 and the fourteenth switching element T14 are turned on. While the emission control reset signal ERST is at the low state, the emission control clock ECLK at the high state is input, so that the eleventh switching element T11 and the twelfth switching element T12 are turned off, and the voltage of the EQ-node is changed to the high state by the emission control clock ECLK. Accordingly, the emission control pull-up switching element EPUT is turned on, and the gate high voltage VGH is applied to the emission control output node EO through the turned-on emission control pull-up switching element EPUT while the emission control clock ECLK is at the high state. That is, the emission control signal EM at the high state is output from the emission control signal output unit 330 while the emission control clock ECLK is at the high state.

Further, when the emission control reset signal ERST is changed to the high state, the eleventh switching element T11 and the twelfth switching element T12 are turned on. Accordingly, the gate low voltage VGL is applied to the EQ-node through the turned-on eleventh switching element T11 so that the emission control pull-up switching element EPUT is turned off. At the same time, the gate high voltage VGH is applied to the EQB-node through the turned-on twelfth switching element T12 so that the emission control pull-down switching element EPDT is turned on. The gate low voltage VGL is applied to the emission control output node EO through the turned-on emission control pull-down switching element EPDT so that the emission control signal EM is changed to the low state. That is, when the voltage of the first scan signal output node SO1 is at the high state and the voltage of the EQ-node is at the high state by the emission control clock ECLK, the emission control signal output unit 330 outputs the gate high voltage VGH through the emission control signal output node EO.

Accordingly, in the second period of time t2, the stage 300 may output simultaneously the first scan signal SCAN1 at the high state through the first scan signal output unit 310 and the emission control signal EM at the high state through the emission control signal output unit 330 while the emission control clock ECLK is at the high state.

Subsequently, referring to FIGS. 4 and 5C, in the third period of time t3, the first clock G1CLK1, the third clock G1CLK3, the fourth clock G1CLK4 and the start voltage VST are applied to the stage 300 at the low state, so that the first switching element T1, the second switching element T2, the third switching element T3, the fourth switching element T4 and the fifth switching element T5 in the first logic circuit 311 are turned off. As the voltage of the Q-node is at the high state, the sixth switching element T6 in the first logic circuit 311 and the first pull-up switching element PUT1 in the first buffer 312 are turned on. As the voltage of the QB-node is at the low state, the first pull-down switching element PDT1 is turned off.

Accordingly, the first clock G1CLK1 at the low state is input through the turned-on first pull-up switching element PUT1, so that the voltage of the low state is applied to the first scan signal output node SO1. That is, as the voltage of the Q-node remains at the high state during the first period of time t1 to the third period of time t3, the first pull-up switching element PUT1 is turned on and the first clock G1CLK1 is output as it is to the first scan signal output node SO1. Accordingly, during the first period of time t1 to the third period of time t3, the first scan signal SCAN1 may be output in a waveform that is substantially the same as the first clock G1CLK1.

On the other hand, in the third period of time t3, as the voltage of the Q node is at the high state, the eighth switching element T8 and the ninth switching element T9 are turned on in the emission control logic circuit 331. Further, while the emission control reset signal ERST is at the high state, the eleventh switching element T11 and the twelfth switching element T12 are turned on. Accordingly, while the emission control reset signal ERST is at the high state, the gate high voltage VGH is applied to the EQB-node through the turned-on eighth switching element T8 and the turned-on twelfth switching element T12. As the voltage of the EQB-node is held at the high state, the emission control pull-down switching element EPDT is turned on, so that the gate low voltage VGL is applied to the emission control output node EO through the turned-on emission control pull-down switching element EPDT. That is, the emission control signal EM is output at the low state during the third period of time t3.

In this manner, the first scan signal output unit 310 is electrically connected to the emission control signal output unit 330 through the Q-node. The emission control signal output unit 330 may be controlled with the voltage of the Q-node and the voltage of the QB-node. Accordingly, in the third period of time t3, the stage 300 may simultaneously output the first scan signal SCAN1 at the low state through the first scan signal output unit 310 and the emission control signal EM at the low state through the emission control signal output unit 330.

Figure 5D:
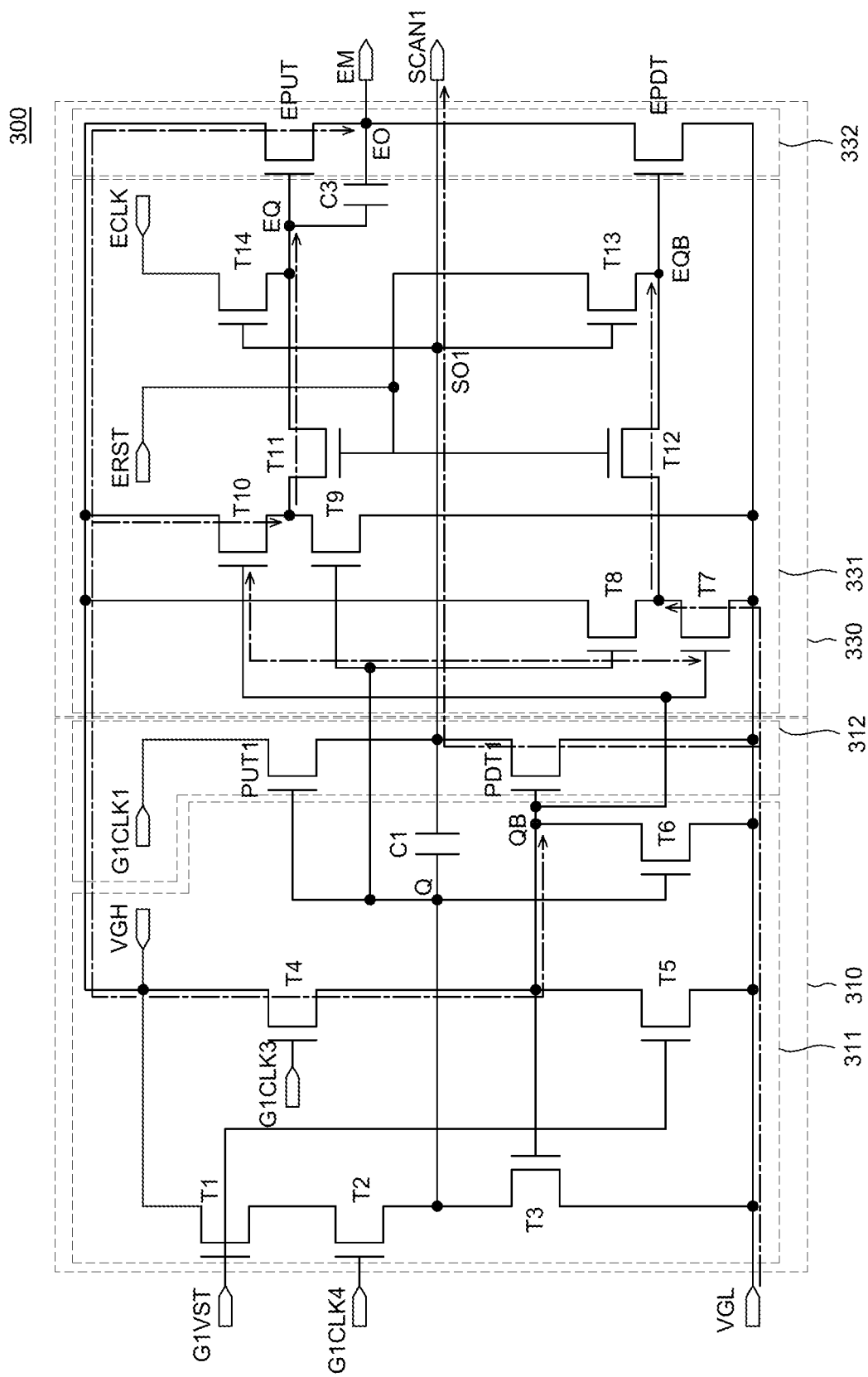

Subsequently, referring to FIGS. 4 and 5D, in the fourth period of time t4, only the third clock CLK3 is input to the stage 300 at the high state, so that only the fourth switching element T4 is turned on in the first logic circuit 311. The gate high voltage VGH is applied to the QB-node through the turned-on fourth switching element T4. As the voltage of the QB-node is at the high state, the first pull-down switching element PDT1 of the first buffer 312 is turned on.

Accordingly, the gate low voltage VGL is applied to the first scan signal output node SO1 through the turned-on first pull-down switching element PDT1. That is, as the voltage of the QB-node is held at the high state until the first period of time t1 starts again after the fourth period of time t4, the gate low voltage VGL is applied to the first scan signal output node 501, so that the first scan signal SCAN1 can be held at the low state.

On the other hand, in the fourth period of time t4, the gate low voltage VGL is applied to the first scan signal output node SO1 by the turned-on first pull-down switching element PDT1, so that the voltage of the Q-node is bootstrapped to the voltage of the first scan signal output node SO1 by coupling of the first capacitor C1. That is, the voltage of the Q-node is dropped to the lower state together with the voltage drop at the first scan signal output node SO1 by the first capacitor C1.

Accordingly, in the fourth period of time t4, the voltage of the Q-node is changed to the low state and the voltage of the QB-node is changed to the high state, so that seventh switching element T7 and the tenth switching element T10 are turned on in the emission control logic circuit 331. Further, while the emission control reset signal ERST is at the high state, the eleventh switching element T11 and the twelfth switching element T12 are turned on. In addition, in the fourth period of time t4, the first scan signal SCAN1 is output at the low state, so that the thirteenth switching element T13 and the fourteenth switching element T14 are turned off.

Accordingly, the gate high voltage VGH is applied to the EQ-node through the turned-on tenth switching element T10 and the turned-on eleventh switching element T11, while the gate low voltage VGL is applied to the EQB-node through the turned-on seventh switching element T7 and the twelfth switching element T12.

As the voltage of the EQ-node is changed to the high state by the gate high voltage VGH, the emission control pull-up switching element EPUT is turned on, and the gate high voltage VGH is applied to the emission control output node EO through the emission control pull-up switching element EPUT. Further, as the gate high voltage VGH is applied to the emission control output node EO, the voltage of the EQ-node is bootstrapped to the voltage of the emission control output node EO by coupling of the third capacitor C3. As a result, even if the emission control reset signal ERST is changed from the high state to the low state, the emission control pull-up switching element EPUT can remain turned on. That is, the emission control signal EM can be held at the high state during the fourth period of time t4 and until the first period of time t1 starts after the fourth period of time t4.

In this manner, the first scan signal output unit 310 is electrically connected to the emission control signal output unit 330 through the Q-node. The emission control signal output unit 330 may be controlled with the voltage of the Q-node and the voltage of the QB-node. Accordingly, in the fourth period of time t4, the stage 300 may simultaneously output the first scan signal SCAN1 at the low state through the first scan signal output unit 310 and the emission control signal EM that is changed from the low state to the high state through the emission control signal output unit 330.

The stage 300 according to the exemplary aspect of the present disclosure may output the first scan signal SCAN1 and control the operation of the emission control signal output unit 330 in each of the first period of time t1 to the fourth period of time t4 based on the voltage of the first scan signal output node SO1. In addition, in the stage 300, the Q-node and the QB-node electrically connect the first scan signal output unit 310 with the emission control signal output unit 330, so that the first scan signal SCAN1 and the emission control signal EM can be output simultaneously from the single stage 300.

Accordingly, the GIPs having the same configuration to simultaneously output the scan signals and the emission control signal may be disposed on the left and right sides, respectively, in the display panel 110, and the area where the gate drivers 130 are disposed in the display panel 110 can be reduced, thereby reducing the size of the bezel of the display device 100.

Figure 6:
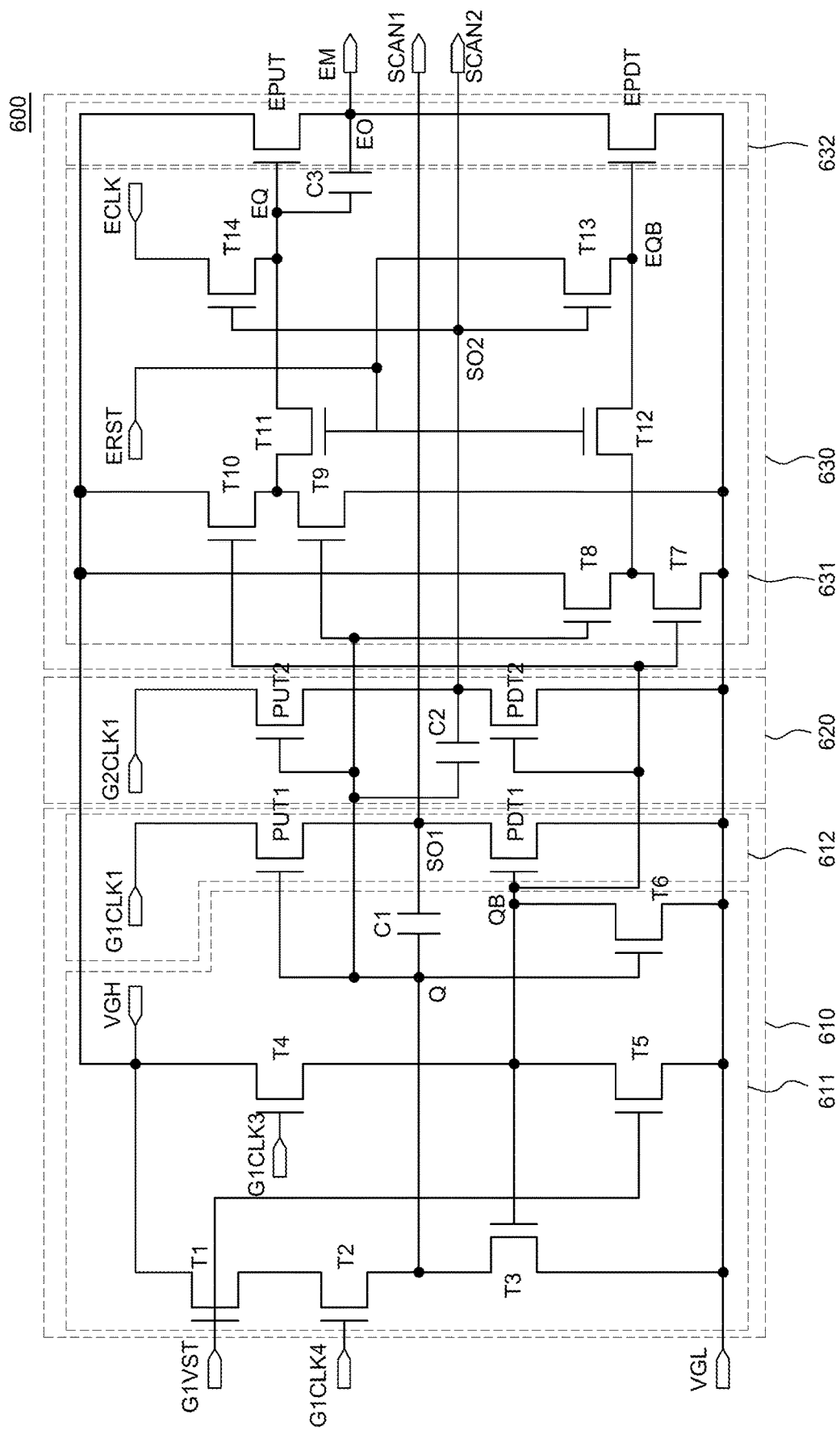
FIG. 6 is a circuit diagram showing a configuration of one of the plurality of stages in the gate drivers according to another exemplary aspect of the present disclosure.

FIG. 6 is a circuit diagram showing a configuration of one of the plurality of stages in the gate drivers according to another exemplary aspect of the present disclosure. FIG. 6 is substantially identical to the circuit diagram shown in FIG. 3 except that a second scan signal output unit 620 is added; and, therefore, a stage 600 and signal flows in response to input/output signals will not be described to avoid redundancy. Descriptions will be made with reference to FIGS. 1, 2 and 4 for convenience of illustration.

Referring to FIG. 6, the stage 600 includes a first scan signal output unit 610 including a first logic circuit 611 and a first buffer 612, a second scan signal output unit 620, and an emission control signal output unit 630 including an emission control logic circuit 631 and an emission control buffer 632. The second scan signal output unit 620 includes a second pull-up switching element PUT2, a second pull-down switching element PDT2, and a second capacitor C2.

Specifically, the second pull-up switching element PUT2 has the gate electrode connected to the Q-node, and is disposed between a fifth clock line for applying a fifth clock G2CLK1 and a second scan signal output node SO2. The second pull-down switching element PDT2 includes the gate electrode connected to the QB-node and is disposed between the gate low voltage line for applying the gate low voltage VGL and the second scan signal output node SO2. Accordingly, the second scan signal output unit 620 may be electrically connected to the Q-node and may output a second scan signal SCAN2 having a phase difference with the first scan signal SCAN1. Further, the voltage of the second scan signal output node SO2 may control the operation of the emission control signal output unit 630. The output waveforms and a phase difference between the first scan signal SCAN1 and the second scan signal SCAN2 will be described later with reference to FIG. 7.

The emission control signal output unit 630 is connected in parallel to the first scan signal output unit 610 and the second scan signal output unit 620 at the Q-node and the QB-node. Specifically, the Q-node is connected to the gate electrode of a first pull-up switching element PUT1, the gate electrode of a sixth switching element T6 and a first capacitor C1 in the first scan signal output unit 610. In addition, the Q-node is connected to the gate electrode of a second pull-up switching element PUT2 and a second capacitor C2 in the second scan signal output unit 620. Further, the Q-node is connected to the gate electrode of an eighth switching element T8 and the gate electrode of a ninth switching element T9 in the emission control signal output unit 630. The QB-node is connected to the gate electrode of a third switching element T3 and the gate electrode of a first pull-down switching element PDT1 in the first scan signal output unit 610. In addition, the QB-node is connected to the gate electrode of a second pull-down switching element PDT2 in the scan signal output unit 620. Further, the QB-node is connected to the gate electrode of a seventh switching element T7 and the gate electrode of a tenth switching element T10 in the emission control signal output unit 630.

In addition, the second scan signal output node SO2 is connected to the gate electrode of the thirteenth switching element T13 and the gate electrode of the fourteenth switching element T14 in the emission control signal output unit 630. Accordingly, the voltage of the second scan signal output node SO2 may determine whether to turn on the thirteenth switching element T13 and the fourteenth switching element T14. Further, the voltage of the second scan signal output node SO2 may determine the timing and period to output the emission control signal EM together with the emission control clock ECLK. The timing and period to output the first scan signal SCAN1, the second scan signal SCAN2 and the emission control signal EM will be described in detail later with reference to FIGS. 7 to 8E.

In the stage 600 according to this exemplary aspect, the first scan signal output unit 610, the second scan signal output unit 620 and the emission control signal output unit 630 are all connected in parallel to the Q-node, the QB-node and the second scan signal output node SO2. Accordingly, the emission control signal output unit 630 may output the emission control signal EM according to the voltage of the Q-node and voltage of the QB-node in the first scan signal output unit 610 and the voltage of the second scan signal output node SO2 in the second scan signal output unit 620. That is, the stage 600 of the gate drivers 130 can simultaneously output the first scan signal SCAN1, the second scan SCAN2 and the emission control signal EM. Moreover, as the stage 600 can simultaneously output the first scan signal SCAN1, the second scan signal SCAN2 and the emission control signal EM, the same GIPs can be disposed on the left and right sides of the display panel 110, respectively. In addition, the area where the gate drivers 130 are disposed can be reduced, so that the size of the bezel of the display device 100 can be reduced.

Figure 7:
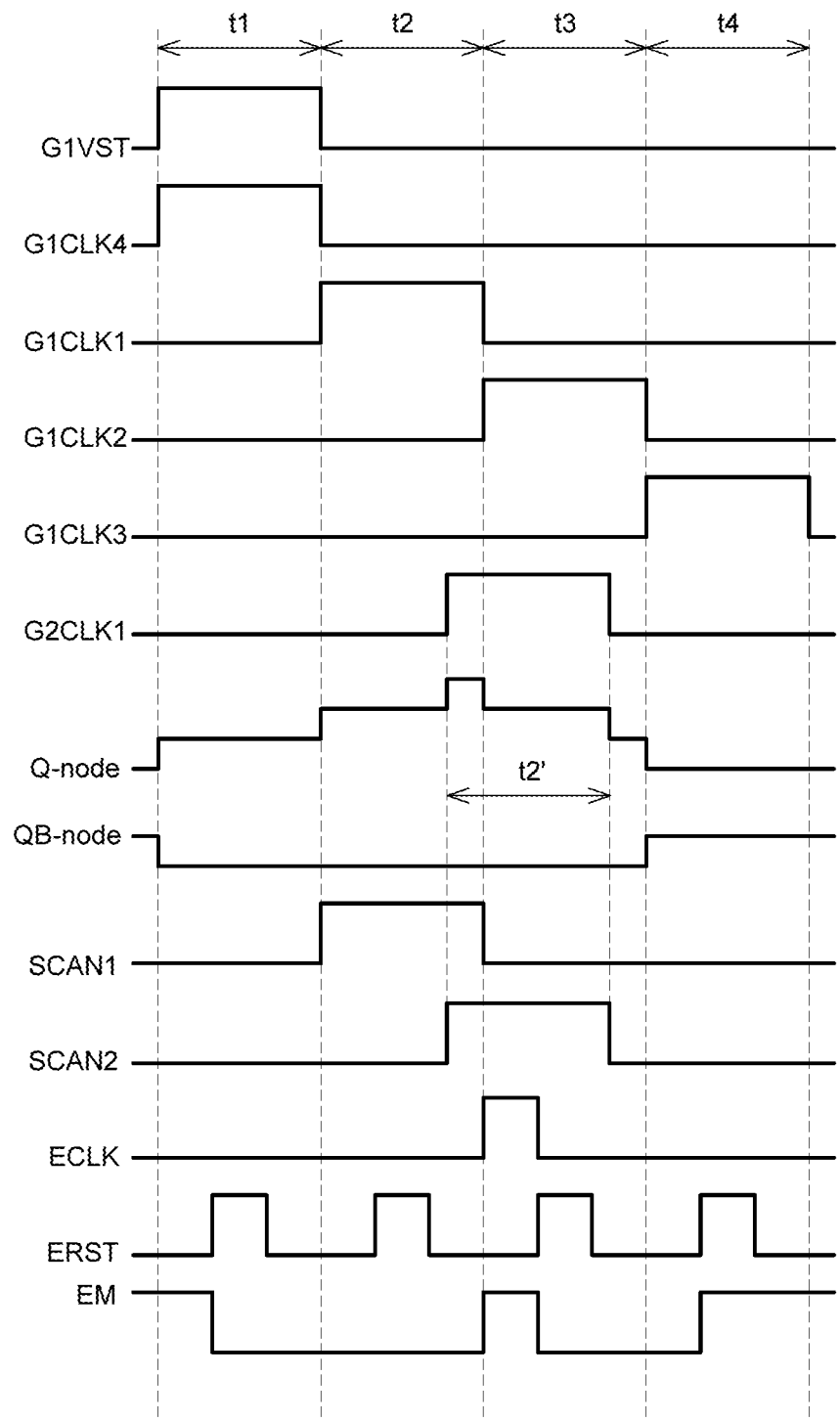
FIG. 7 is a waveform diagram showing input/output signals to/from the stage of the gate driver shown in FIG. 6 according to another exemplary aspect of the present disclosure.

FIG. 7 is a waveform diagram showing input/output signals to/from the stage of the gate driver shown in FIG. 6 according to another exemplary aspect of the present disclosure. FIGS. 8A to 8E are circuit diagrams illustrating signal flows in the stages of the gate driver according to the waveform diagram shown in FIG. 7 according to an exemplary aspect of the present disclosure. The circuit diagrams shown in FIGS. 8A to 8E illustrate signal flows during different period of times in response to input signals. The circuit diagrams shown in FIGS. 8A to 5E include the elements identical to those of the circuit diagram shown in FIG. 6; and, therefore, the stage 600 will not be described to avoid redundancy. In FIGS. 8A to 8E, dash-dot lines indicate the flows of the internal signals in response to the signals input to the stage 600. Descriptions will be made with reference to FIGS. 1, 2 and 4 for convenience of illustration.

Referring to FIG. 7, based on the pulse timings of a first clock G1CLK1, a second clock G1CLK2, a third clock G1CLK3, a fourth clock G1CLK4, a fifth clock G2CLK1 and a start voltage VST applied to the stage 600, the stage 600 operates such that the first scan signal SCAN1 is output differently during the first period of time t1, the second period of time t2, the third period of time t3 and the fourth period of time t4 while the scan signal SCAN2 is output in a sub-second period of time t2'.

In the sub-second period of time t2', the fifth clock G2CLK1 is input to the second scan signal output unit 620 of the stage 600 at the high state. That is, for the first scan signal output unit 610, the first clock signal G1CLK1 is changed from the high state to the low state in the second and third periods of time t2 and t3. The third clock G1CLK3 and the fourth clock G1CLK4 are held at the low state, and the fifth clock G2CLK1 is input to the stage 600 at the high state in the sub-second period t2'.

Accordingly, the first scan signal output unit 610 outputs the first scan signal SCAN1 in the second period of time t2, while the second scan signal output unit 620 outputs the second scan signal SCAN2 in the sub-second period of time t2'. Further, the emission control signal output unit 630 outputs the emission control signal EM according to the emission control clock ECLK while the second scan signal SCAN2 is at the high state. That is, the stage 600 of the gate drivers 130 according to this exemplary aspect can simultaneously output the first scan signal SCAN1, the second scan signal SCAN2 and the emission control signal EM.

The circuit diagrams shown in FIGS. 8A, 8B, 8D and 8E are substantially identical to the circuit diagrams shown in FIGS. 5A to 5D except that the second scan signal output unit 620 is additionally connected thereto. The configuration and operation in response to the signal flows are substantially identical to those of FIGS. 5A to 5D; and, therefore, the signal flows in response to the input/output signals in the stage 600 and the operation of the stage 600 will not be described to avoid redundancy. Hereinafter, description will be mad focusing on the difference between the operation of the stage 600 including the second scan signal output unit 620 and the operation of the stage 300 in the first period of time t1 to the fourth period of time t4 and the sub-second period t2'.

Figure 8A:
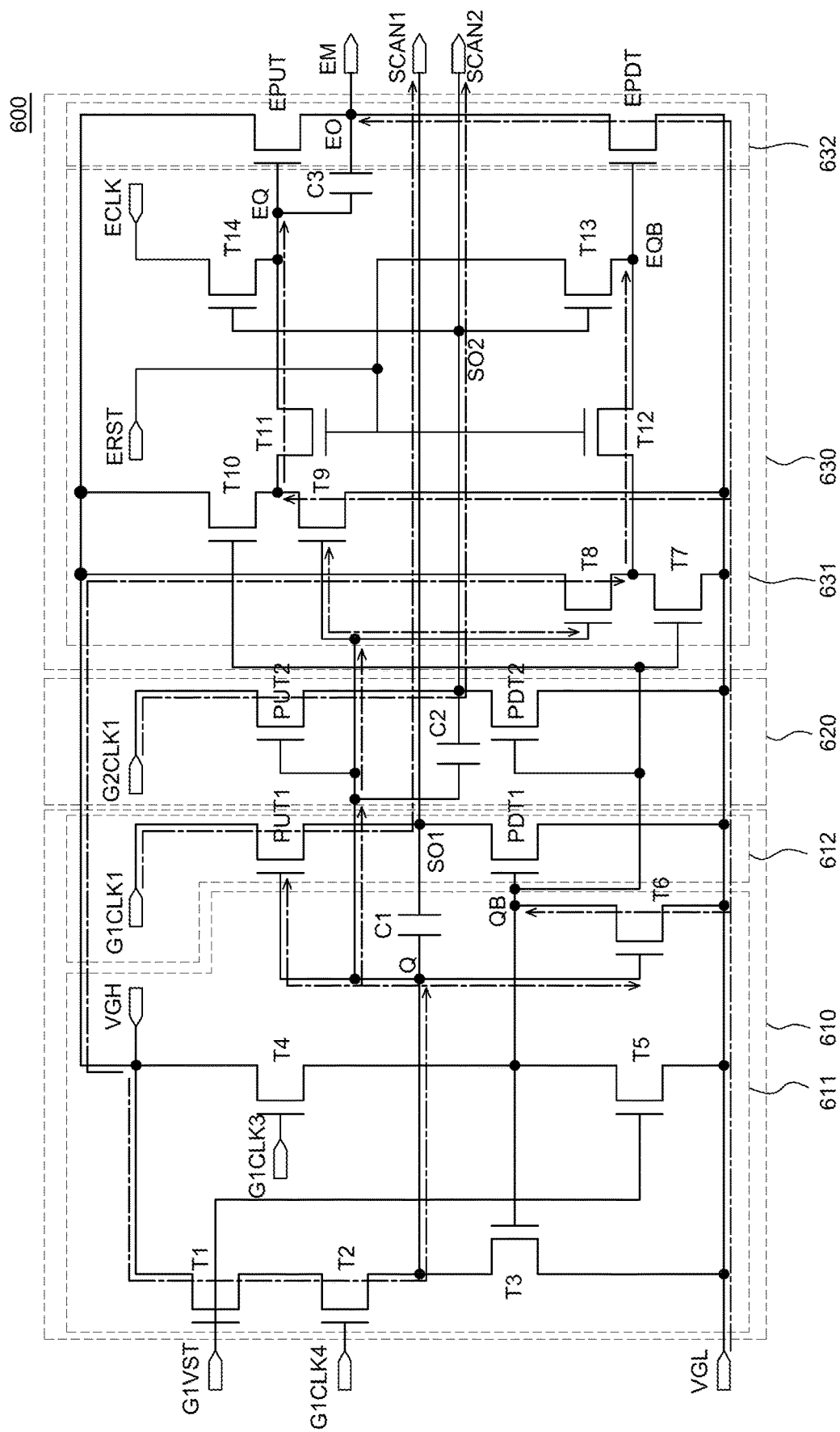
FIGS. 8A to 8E are circuit diagrams illustrating signal flows in the stages of the gate driver according to the waveform diagram shown in FIG. 7 according to an exemplary aspect of the present disclosure.

Referring to FIGS. 7 and 8A, in the first period of time t1, the start voltage VST and the fourth clock CLK4 are input to the stage 600 at the high state, so that the first switching element T1, the second switching element T2 and the fifth switching element T5 are all turned on. Further, the gate high voltage VGH is applied to the Q-node as the second switching element T2 is turned on. As the fifth switching element T5 is turned on, the gate low voltage VGL is applied to the QB-node. That is, in the first period of time t1, the voltage of the Q node is at the high state and the voltage of the QB node is at the low state.

Further, as the voltage of the Q-node is at the high state, the second pull-up switching element PUT2 is turned on in the second scan signal output unit 620. As the second pull-up switching element PUT2 is turned on, the fifth clock G2CLK1 is input to the second scan signal output node SO2 at the low state. That is, in the first period of time t1, the second scan signal output unit 620 outputs the second scan signal SCAN2 at the low state.

In addition, in the emission control signal output unit 630, the voltage of the EQ-node is changed to the low state as soon as the emission control reset signal ERST is input at the high state, and the emission control pull-down switching element EPDT is turned on as the voltage of the EQB-node is changed to the high state. That is, the twelfth switching element T12 is turned on as soon as the emission control reset signal ERST is changed to the high state, so that the emission control signal EM is changed to the low state.

Accordingly, in the stage 60, in the first period of time t1, the first scan signal output unit 610 may output the first scan signal SCAN1 at the low state and the second scan signal output unit 620 may output the second scan signal SCAN2 at the low state simultaneously, and the emission control signal output unit 630 may output the emission control signal EM changed from the high state to the low state as soon as the emission control reset signal ERST is input at the high state.

Figure 8B:
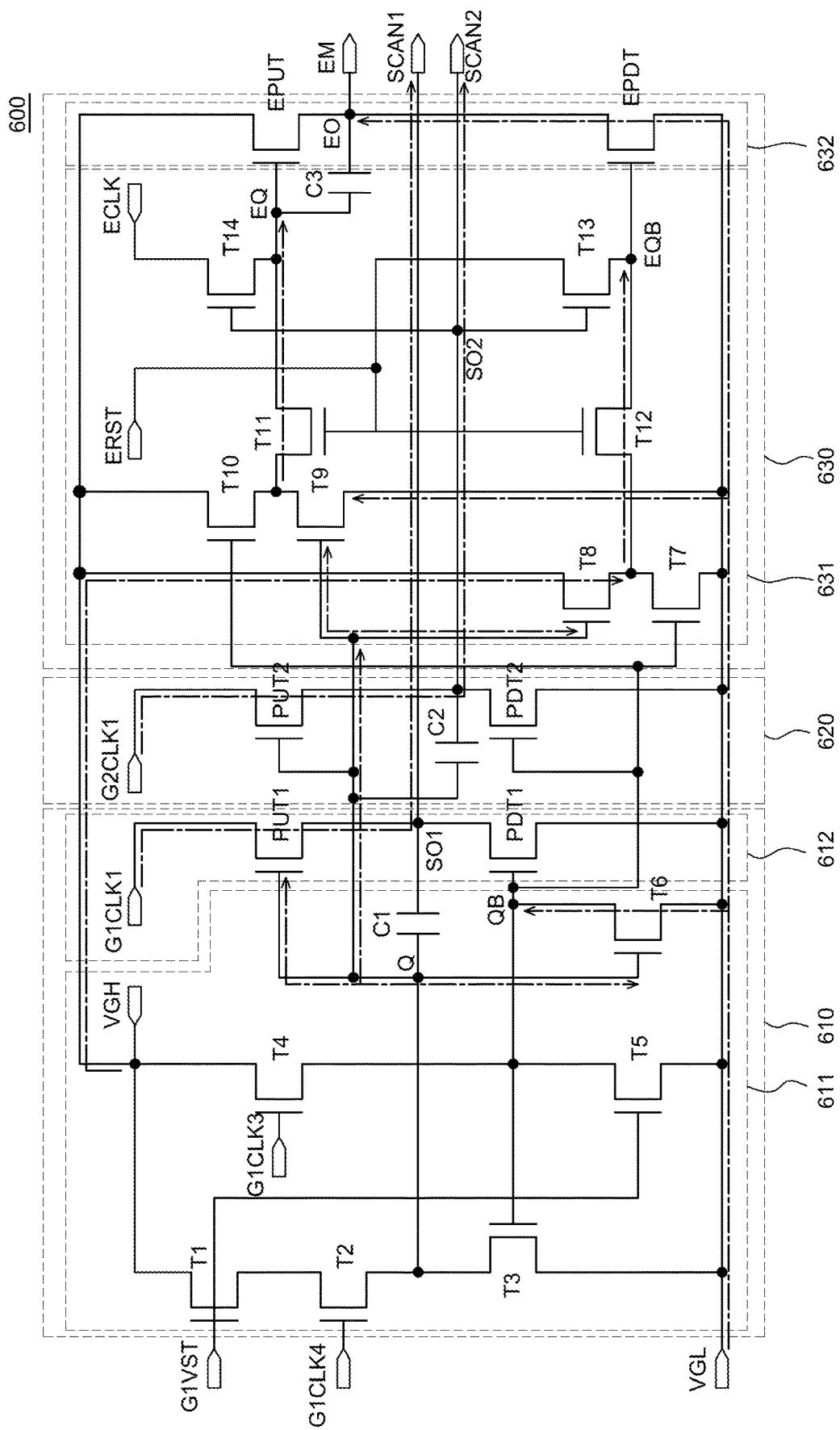

Referring to FIG. 7 and FIG. 8B, in the second period t2, the voltage of the Q-node is at the high state so that the second pull-up switching element PUT2 is turned on in the second scan signal output unit 620, and the voltage of the QB-node is at the low state so that the second pull-down switching element PDT2 is turned off.

Accordingly, the fifth clock G2CLK1 at the high state is applied to the second scan signal output node SO2 through the turned-on second pull-up switching element PUT2. That is, when the voltage of the Q-node is at the high state, the second scan signal output unit 620 outputs the fifth clock G2CLK1 at the high state as the second scan signal SCAN2 through the second scan signal output node SO2.

Figure 8C:
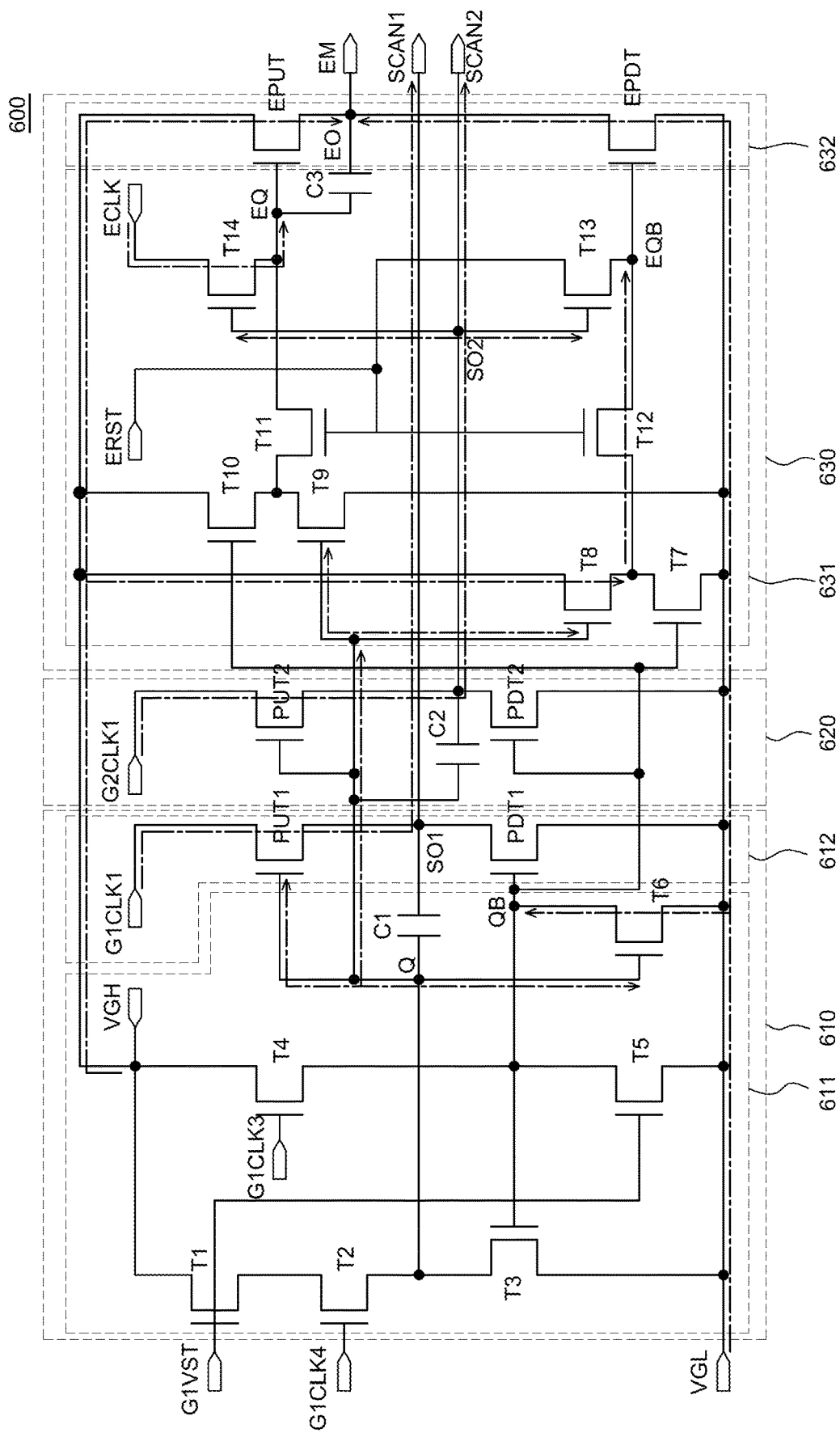

Referring to FIGS. 7 and 8C, in the sub-second period of time t2', the first clock G1CLK1 is changed from the high state to the low state and is input to the stage 600, the third clock G1CLK3 is input at the low state, and the fifth clock G2CLK1 is input at the high state. In addition, as the voltage of the Q-node is at the high state during the sub-second period of time t2', the first pull-up switching element PUT1 and the second pull-up switching element PUT2 are turned on.

Accordingly, while the first clock signal G1CLK1 is at the high state during the sub-second period of time t2', the first clock G1CLK1 at the high state is output to the first scan signal output node SO1, and the fifth clock G2CLK1 at the high state is output to the second scan signal output node SO2.

Further, the voltage of the Q-node is bootstrapped to the voltage of the first scan signal output node SO1 by the coupling of the first capacitor C1, and the voltage of the Q-node is also bootstrapped to the voltage of the second scan signal output node SO2 by the coupling of the second capacitor C2. That is, the voltage of the Q-node is bootstrapped by the first capacitor C1 and also by the second capacitor C2, so that it is substantially raised by the first scan signal SCAN1 and the second scan signal SCAN2, which are at the high state.

On the other hand, in the sub-second period of time t2', as the voltage of the Q node is at the high state, the eighth switching element T8 and the ninth switching element T9 are turned on in the emission control logic circuit 331. In addition, as the voltage of the second scan signal output node SO2 is at the high state in the sub-second period of time t2', the thirteenth switching element T13 and the fourteenth switching element T14 are turned on. While the emission control reset signal ERST is at the low state, the emission control clock ECLK at the high state is input, so that the eleventh switching element T11 and the twelfth switching element T12 are turned off, and the voltage of the EQ-node is changed to the high state by the emission control clock ECLK. Accordingly, the emission control pull-up switching element EPUT is turned on, and the gate high voltage VGH is applied to the emission control output node EO through the turned-on emission control pull-up switching element EPUT while the emission control clock ECLK is at the high state. That is, the emission control signal EM at the high state is output from the emission control signal output unit 630 while the emission control clock ECLK is at the high state.

Further, when the emission control reset signal ERST is changed to the high state, the eleventh switching element T11 and the twelfth switching element T12 are turned on.

Accordingly, the gate low voltage VGL is applied to the EQ node through the turned-on eleventh switching element T11 so that the emission control pull-up switching element EPUT is turned off. At the same time, the gate high voltage VGH is applied to the EQB node through the turned-on twelfth switching element T12 so that the emission control pull-down switching element EPDT is turned on. The gate low voltage VGL is applied to the emission control output node EO through the turned-on emission control pull-down switching device EPDT so that the emission control signal EM is changed to the low state. That is, when the voltage of the second scan signal output node SO2 is at the high state and the voltage of the EQ node is at the high state by the emission control clock ECLK, the emission control signal output unit 630 outputs the gate high voltage VGH through the emission control signal output node EO.

Accordingly, in the sub-second period of time t2', the stage 600 may output simultaneously the second scan signal SCAN2 at the high state through the second scan signal output unit 620 and the emission control signal EM at the high state through the emission control signal output unit 630 while the emission control clock ECLK is at the high state. For the first scan signal output unit 610, the sub-second period of time t2' exists between the second period of time t2 and the third period of time t3, and accordingly the first scan signal SCAN1, the second scan signal SCAN2 and the emission control signal EM can be simultaneously output during the sub-second period of time t2'.

Figure 8D:
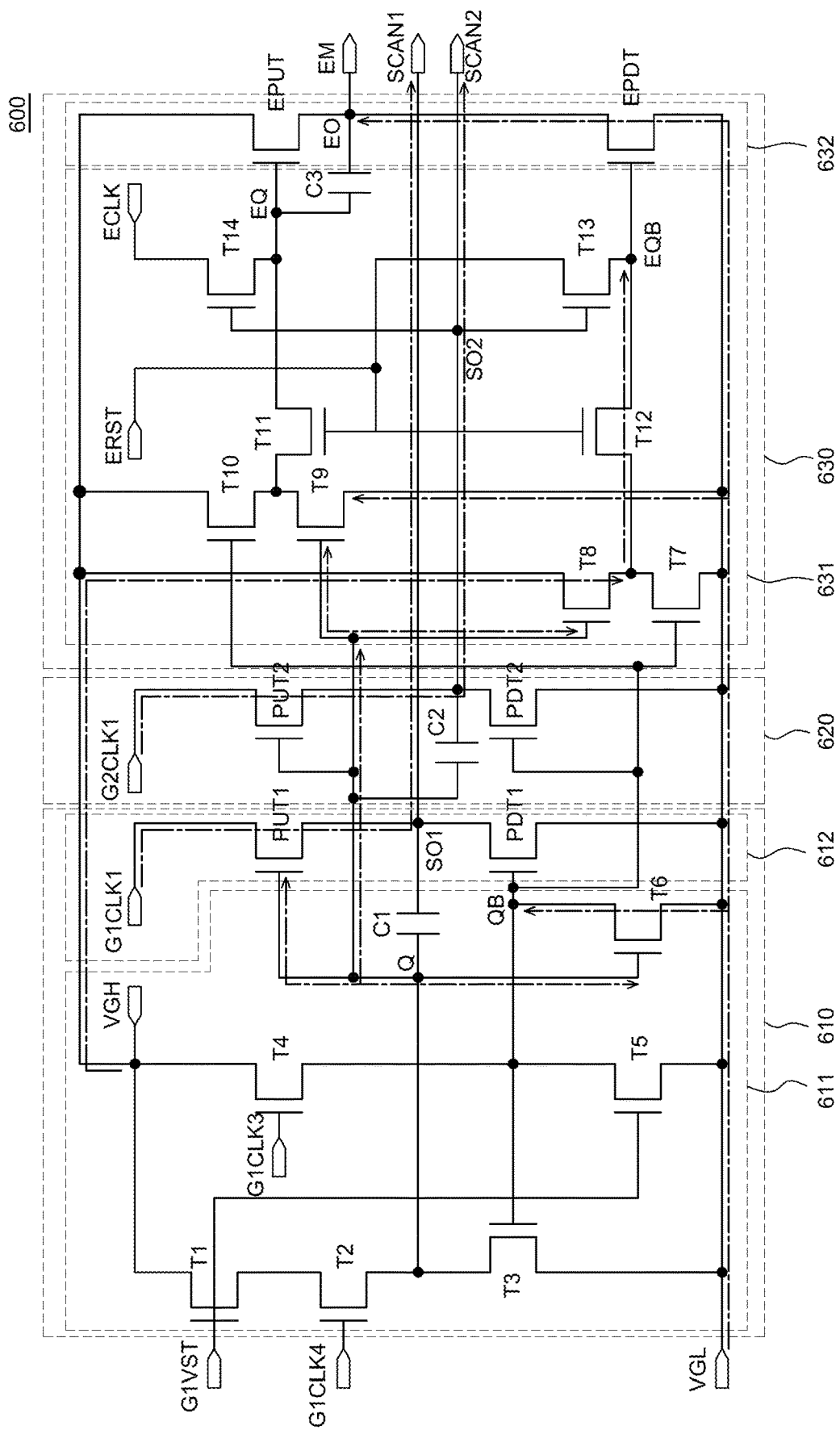

Referring to FIG. 7 and FIG. 8D, the voltage of the Q-node is still at the high state in the third period of time t3 other than the sub-second period of time t2', and thus the second pull-up switching element PUT2 is turned on in the second scan signal output unit 620, and the voltage of the QB-node is at the low state so that the second pull-down switching element PDT2 is turned off.

Accordingly, the fifth clock G2CLK1 at the high state is applied to the second scan signal output node SO2 through the turned-on second pull-up switching element PDT2. That is, when the voltage of the Q-node is at the high state, the second scan signal output unit 620 outputs the fifth clock G2CLK1 at the high state as the first scan signal SCAN1 through the second scan signal output node SO2.

Figure 8E:
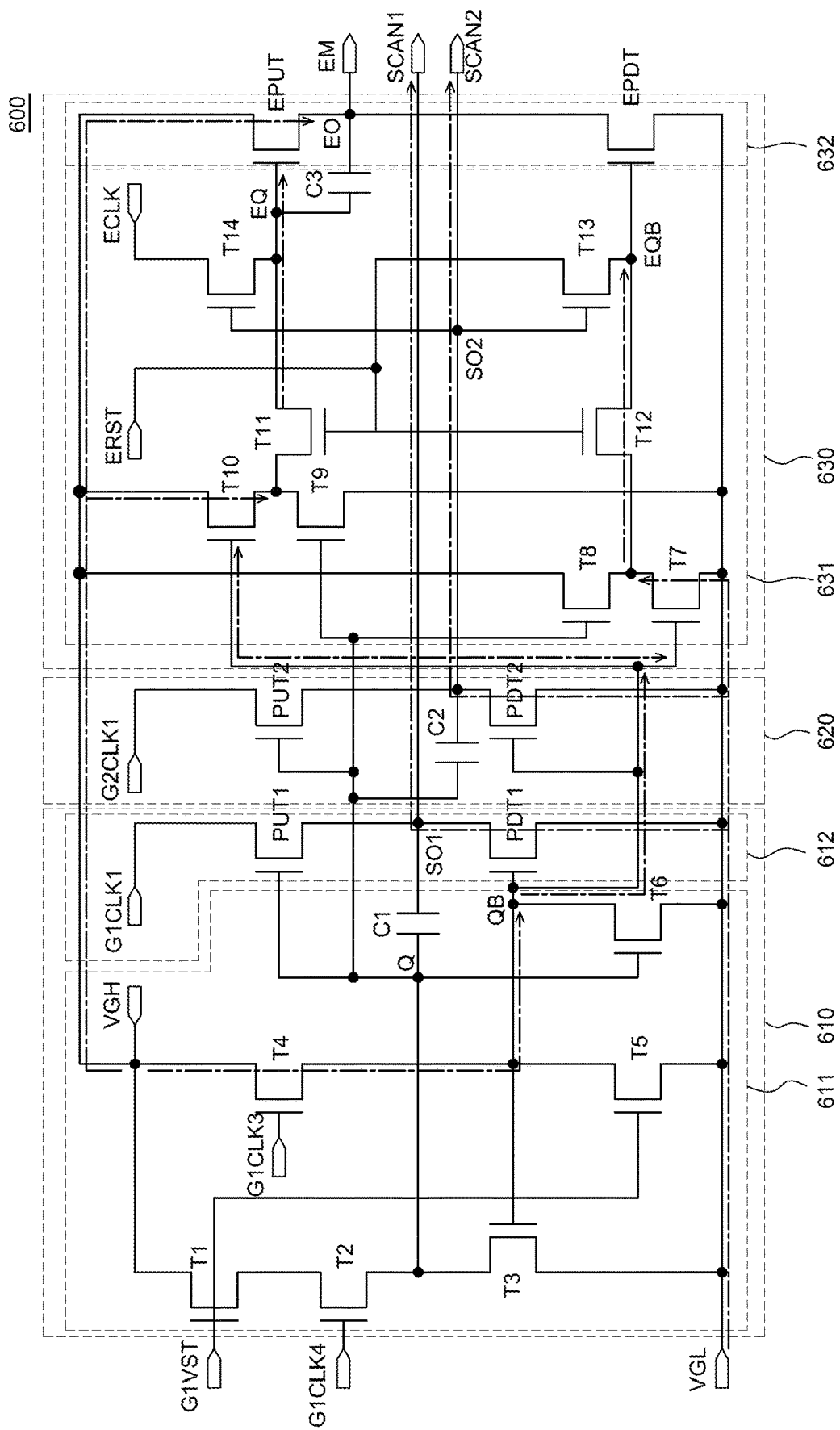

Referring to FIGS. 7 and 8E, in the fourth period of time t4, only the third clock CLK3 is input to the stage 600 at the high state, so that only the fourth switching element T4 is turned on in the first scan signal output unit 610. The gate high voltage VGH is applied to the QB node through the turned-on fourth switching element T4. As the voltage of the QB-node is at the high state, the first pull-down switching element PDT1 of the first buffer 612 is turned on. In addition, the second pull-down switching element PDT2 in the second scan signal output unit 620 is also turned on.

Accordingly, the gate low voltage VGL is applied to the second scan signal output node SO2 through the turned-on second pull-down switching element PDT2. That is, as the voltage of the QB-node is held at the high state until the first period of time t1 starts again after the fourth period of time t4, the gate low voltage VGL is applied to the second scan signal output node SO2, so that the second scan signal SCAN2 may be held at the low state.

On the other hand, in the fourth period of time t4, the gate low voltage VGL is applied to each of the first scan signal output node SO1 and the second scan signal output node SO2 through the turned-on first pull-down switching element PDT1 and the turned-on second pull-down switching element PDT2 so that the voltage of the Q-node is bootstrapped to the voltage of the first scan signal output node SO1 by the coupling of the first capacitor C1, and the voltage of the Q-node is bootstrapped to the voltage of the second scan signal output node SO2 by the coupling of the second capacitor C2. That is, the voltage of the Q-node is dropped to the low state by the voltage drop at the first scan signal output node SO1 and the second scan signal output node SO2 by the first capacitor C1 and the second capacitor C2, respectively.

Accordingly, in the fourth period of time t4, the voltage of the Q-node is changed to the low state and the voltage of the QB-node is changed to the high state, so that seventh switching element T7 and the tenth switching element T10 are turned on in the emission control logic circuit 331. Further, while the emission control reset signal ERST is at the high state, the eleventh switching element T11 and the twelfth switching element T12 are turned on. In addition, in the fourth period of time t4, the second scan signal SCAN2 is output at the low state, so that the thirteenth switching element T13 and the fourteenth switching element T14 are turned off.

Accordingly, the gate high voltage VGH is applied to the EQ-node through the turned-on tenth switching element T10 and the turned-on eleventh switching element T11, while the gate low voltage VGL is applied to the EQB node through the turned-on seventh switching element T7 and the twelfth switching element T12.

As the voltage of the EQ node is changed to the high state by the gate high voltage VGH, the emission control pull-up switching element EPUT is turned on, and the gate high voltage VGH is applied to the emission control output node EO through the emission control pull-up switching element EPUT. Further, as the gate high voltage VGH is applied to the emission control output node EO, the voltage of the EQ node is bootstrapped to the voltage of the emission control output node EO due to coupling by the third capacitor C3. As a result, even if the emission control reset signal ERST is changed from the high state to the low state, the emission control pull-up switching element EPUT can remain turned on. That is, the emission control signal EM can be held at the high state during the fourth period of time t4 and until the first period t1 starts after the fourth period t4.

In this manner, the first scan signal output unit 610, the second scan signal output unit 620 and the emission control signal output unit 630 are electrically connected to one another through the Q-node. The emission control signal output unit 630 may be controlled with the voltage of the Q-node and the voltage of the QB-node. Accordingly, in the fourth period of time t4, the stage 600 may simultaneously output the second scan signal SCAN2 at the low state through the second scan signal output unit 620, the emission control signal EM that is changed from the low state to the high state through the emission control signal output unit 630, and the first scan signal SCAN1 that is output independently.

The stage 600 according to the exemplary aspect of the present disclosure may output the second scan signal SCAN2 and control the operation of the emission control signal output unit 630 in each of the first period of time t1 to the fourth period of time t4 based on the voltage of the second scan signal output node SO. In addition, in the stage 600, the Q-node and the QB-node electrically connect the first scan signal output unit 610, the second scan signal output unit 620 and the emission control signal output unit 630 with one another, so that the first scan signal SCAN1, the second scan signal SCAN2 and the emission control signal EM can be output simultaneously from the single stage 600.

In addition, the second scan signal output unit 620 does not include any additional logic circuit and may share the logic circuit 611 with the first scan signal output unit 610, thereby simplifying the configuration of the stage 600 of the gate driver 130.

Accordingly, the GIPs having the same configuration to simultaneously output the scan signals and the emission control signal may be disposed on the left and right sides, respectively, in the display panel 110, and the area where the gate drivers 130 are disposed in the display panel 110 can be reduced, thereby reducing the size of the bezel of the display device 100.

The exemplary aspects of the present disclosure can also be described as follows:

According to an aspect of the present disclosure, there is provided a gate driver. The gate driver included a plurality of stages. The nth stage of the plurality of stages includes a first scan signal output unit configured to output the kth clock as a first scan signal through a first scan signal output node when a voltage of a Q-node is at a high state, and an emission control signal output unit configured to output a gate high voltage (VGH) through an emission control signal output node when a voltage of the first scan signal output node is at the high state and a voltage of an EQ-node is at the high state by an emission control clock (n and k are positive integers). The emission control signal output unit is electrically connected to the Q-node. The gate driver includes a scan signal output part as well as an emission control signal output part, so that GIPs having the same configuration can be disposed on the left and right sides of a display panel.

The first scan signal output unit may include a first logic circuit and a first buffer, and the first buffer may include a first pull-up switching element having a gate electrode connected to the Q-node and disposed between a kth clock line for applying the kth clock and the first scan signal output node; and a first pull-down switching element having a gate electrode connected to a QB-node and disposed between a gate low voltage line for applying a gate low voltage (VGL) and the first scan signal output node. A voltage of the first scan signal output node may control operation of the emission control signal output unit, and the first logic circuit may output the voltage of the Q-node and the voltage of the QB-node so that they are opposite to each other.

The emission control signal output unit may be connected in parallel with the first scan signal output unit at the Q-node and the QB-node.

The first logic circuit may include: a first switching element having a gate electrode to receive a first start voltage and connected to a gate high voltage line for applying the gate high voltage; a second switching element having a gate electrode to receive a $(k+3)^{th}$ clock and connected to the Q-node; a third switching element having a gate electrode connected to the QB-node and disposed between the gate low voltage line and the second switching element; a fourth switching element having a gate electrode to receive a $(k+2)^{th}$ clock and connected to the gate high voltage line; and a fifth switching element having a gate electrode to receive the first start voltage and disposed between the gate low voltage line and the fourth switching element; a sixth switching element having a gate electrode connected to the Q-node and disposed between the QB-node and the gate low voltage line; and a first capacitor disposed between the Q-node and the first scan signal output node. The emission control signal output unit may be electrically connected to the first scan signal output unit through the Q-node and the QB-node.

The emission control signal output unit may include an emission control logic circuit and an emission control buffer, and the emission control buffer may include an emission control pull-up switching element having a gate electrode connected to the EQ-node and connected to a gate high voltage line for applying the gate high voltage; and an emission control pull-down switching element having a gate electrode connected to an EQB-node and disposed between a gate low voltage line for applying a gate low voltage and the emission control signal output node.

The emission control logic circuit may include a first emission control switching element having a gate electrode connected to the first scan signal output node and disposed between an emission control clock line for applying the emission control clock and the EQ-node; a second emission control switching element having a gate electrode connected to the first scan signal output node and disposed between an emission control reset signal line for applying an emission control reset signal and the EQB-node; and a third capacitor disposed between the EQ-node and the emission control signal output node.

The nth stage may further include: a second scan signal output unit electrically connected to the Q-node and configured to output a second scan signal having a phase difference with the first scan signal.

The second scan signal output unit may include a second pull-up switching element having a gate electrode connected to the Q-node and disposed between a fifth clock line for applying a fifth clock and the second scan signal output node; and a second pull-down switching element having a gate electrode connected to the QB-node and disposed between a gate low voltage line for applying a gate low voltage and the second scan signal output node.

The emission control signal output unit may be connected in parallel with the first scan signal output unit and the second scan signal output unit at the Q-node and the QB-node.

The emission control signal output unit may include an emission control logic circuit and an emission control buffer, and the emission control buffer may include an emission control pull-up switching element having a gate electrode connected to the EQ-node and connected to a gate high voltage line for applying the gate high voltage; and an emission control pull-down switching element having a gate electrode connected to an EQB-node and disposed between a gate low voltage line for applying a gate low voltage and the emission control signal output node.

The emission control logic circuit may include a first emission control switching element having a gate electrode connected to the first scan signal output node and disposed between an emission control clock line for applying the emission control clock and the EQ-node; a second emission control switching element having a gate electrode connected to the first scan signal output node and disposed between an emission control reset signal line for applying an emission control reset signal and the EQB-node; and a third capacitor disposed between the EQ-node and the emission control signal output node.

According to another aspect of the present disclosure, there is provided a display device. The display device includes a display panel including a plurality of pixels, and a gate driver disposed in the display panel and configured to apply gate signals through gate lines connected to each of the plurality of pixels. The gate driver includes a first scan signal output unit configured to output a kth clock as a first scan signal through a first scan signal output node between a pull-up switching element having a gate electrode connected to a Q-node and a pull-down switching element having a gate electrode connected to a QB-node, and an emission control signal output unit configured to output a gate high voltage synchronized to an emission control clock through an emission control signal output node between an emission control pull-up switching element having a gate electrode connected to an EQ-node and an emission control pull-down switching element having a gate electrode connected to an EQB-node. The emission control signal output unit is connected in parallel to the first scan signal output unit at the Q-node and the QB-node. In the display device, a single gate driver can output scan signals and an emission control signal simultaneously, so that the size of the area where the gate driver is disposed to thereby reduce the size of the bezel of the display device.

The gate driver may further include a second scan signal output unit electrically connected to the Q-node and configured to output a second scan signal having a phase difference with the first scan signal, and wherein the second scan signal output unit comprises a second pull-up switching element having a gate electrode connected to the Q-node and disposed between a fifth clock line for applying a fifth clock and the second scan signal output node; and a second pull-up switching element having a gate electrode connected to the QB-node and disposed between a gate low voltage line for applying a gate low voltage and the second scan signal output node.

The emission control signal output unit may be connected in parallel with the first scan signal output unit and the second scan signal output unit at the Q-node and the QB-node.

Thus far, exemplary aspects of the present disclosure have been described in detail with reference to the accompanying drawings. However, the present disclosure is not limited to the exemplary aspects, and modifications and variations can be made thereto without departing from the technical idea of the present disclosure. Accordingly, the exemplary aspects described herein are merely illustrative and are not intended to limit the scope of the present disclosure. The technical idea of the present disclosure is not limited by the exemplary aspects. The scope of protection sought by the present disclosure is defined by the appended claims and all equivalents thereof are construed to be within the true scope of the present disclosure.

What is claimed is:

1. A gate driver including a plurality of stages having an nth stage, the $n^{th}$ stage comprising:
    a first circuit configured to output a $k^{th}$ clock as a first scan signal through a first scan signal output node when a voltage of a Q-node is at a high state and a voltage of a QB-node is at low state; and
    an emission circuit configured to output a gate high voltage (VGH) through an emission control signal output node if (1) a voltage of the first scan signal output node is at the high state and (2) a voltage of an EQ-node is at the high state by an emission control clock (where n and k are positive integers),
    wherein the emission circuit is electrically connected to the Q-node; and
    wherein the emission circuit includes an emission control logic circuit and an emission control buffer, the emission control logic circuit including:
        a first emission control switching element having a gate electrode connected to the first scan signal output node and disposed between an emission control clock line for applying the emission control clock and the EQ-node;
        a second emission control switching element having a gate electrode connected to the first scan signal output node and disposed between an emission control reset signal line for applying an emission control reset signal and the EQB-node; and
        a third capacitor disposed between the EQ-node and the emission control signal output node.

2. The gate driver of claim 1, wherein the emission control buffer comprises:
    an emission control pull-up switching element having a gate electrode connected to the EQ-node and connected to a gate high voltage line for applying the gate high voltage; and
    an emission control pull-down switching element having a gate electrode connected to an EQB-node and disposed between a gate low voltage line for applying a gate low voltage and the emission control signal output node.

3. The gate driver of claim 1, wherein the first circuit includes a first logic circuit and a first buffer.

4. The gate driver of claim 3, wherein the first buffer comprises:
    a first pull-up switching element having a gate electrode connected to the Q-node and disposed between a $k^{th}$ clock line for applying the $k^{th}$ clock and the first scan signal output node; and
    a first pull-down switching element having a gate electrode connected to the QB-node and disposed between a gate low voltage line for applying a gate low voltage (VGL) and the first scan signal output node.

5. The gate driver of claim 4, wherein a voltage of the first scan signal output node is configured to control operation of the emission circuit, and the first logic circuit outputs the voltage of the Q-node and the voltage of the QB-node, so that they are opposite to each other.

6. The gate driver of claim 4, wherein the first logic circuit comprises:
    a first switching element having a gate electrode to receive a first start voltage and connected to a gate high voltage line for applying the gate high voltage;
    a second switching element having a gate electrode to receive a $(k+3)^{th}$ clock and connected to the Q-node;
    a third switching element having a gate electrode connected to the QB-node and disposed between the gate low voltage line and the second switching element;
    a fourth switching element having a gate electrode to receive a $(k+2)^{th}$ clock and connected to the gate high voltage line;
    a fifth switching element having a gate electrode to receive the first start voltage and disposed between the gate low voltage line and the fourth switching element; and
    a sixth switching element having a gate electrode connected to the Q-node and disposed between the QB-node and the gate low voltage line; and a first capacitor disposed between the Q-node and the first scan signal output node,
    wherein an emission control signal output block is electrically connected to the first circuit through the Q-node and the QB-node.

7. The gate driver of claim 1, further comprising a second circuit electrically connected to the Q-node and configured to output a second scan signal having a phase difference from the first scan signal.

8. The gate driver of claim 7, wherein the second circuit comprises:

a second pull-up switching element having a gate electrode connected to the Q-node and disposed between a fifth clock line for applying a fifth clock and the second scan signal output node; and a second pull-down switching element having a gate electrode connected to the QB-node and disposed between a gate low voltage line for applying a gate low voltage and the second scan signal output node.

9. The gate driver of claim 8, wherein the emission circuit is connected in parallel with the first circuit and the second circuit at the Q-node and the QB-node.

10. A display device comprising:

a display panel including a plurality of pixels; and a gate driver disposed in the display panel and configured to apply gate signals through gate lines connected to each of the plurality of pixels, wherein the gate driver comprises, a first circuit configured to output a $k^{th}$ clock as a first scan signal through a first scan signal output node between a pull-up switching element having a gate electrode connected to a Q-node and a pull-down switching element having a gate electrode connected to a QB-node; and an emission circuit configured to output a gate high voltage synchronized to an emission control clock through an emission control signal output node between an emission control pull-up switching element having a gate electrode connected to an EQ-node and an emission control pull-down switching element having a gate electrode connected to an EQB-node, wherein the emission circuit is connected in parallel to the first circuit at the Q-node and the QB-node; and wherein the emission circuit includes an emission control logic circuit and an emission control buffer, the emission control logic circuit including:

a first emission control switching element having a gate electrode connected to the first scan signal output node and disposed between an emission control clock line for applying the emission control clock and the EQ-node;

a second emission control switching element having a gate electrode connected to the first scan signal output node and disposed between an emission control reset signal line for applying an emission control reset signal and the EQB-node; and a third capacitor disposed between the EQ-node and the emission control signal output node.

11. The display device of claim 10, wherein the gate driver further comprises a second circuit electrically connected to the Q-node and configured to output a second scan signal having a phase difference with the first scan signal.

12. The display device of claim 11, wherein the second circuit comprises:

a second pull-up switching element having a gate electrode connected to the Q-node and disposed between a fifth clock line for applying a fifth clock and the second scan signal output node; and a second pull-up switching element having a gate electrode connected to the QB-node and disposed between a gate low voltage line for applying a gate low voltage and the second scan signal output node.

13. The display device of claim 12, wherein the emission circuit is connected in parallel with the first circuit and the second circuit at the Q-node and the QB-node.

* * * * *